(12) United States Patent
Umezawa et al.

(10) Patent No.: US 8,169,253 B2
(45) Date of Patent: May 1, 2012

(54) POWER CIRCUIT INCLUDING STEP-UP CIRCUIT AND STABILIZING METHOD THEREOF

(75) Inventors: Akira Umezawa, Tokyo (JP); Masaaki Kuwagata, Yokohama (JP); Yasuhiko Honda, Hiratsuka (JP); Gyosho Chin, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 384 days.

(21) Appl. No.: 12/608,417

(22) Filed: Oct. 29, 2009

(65) Prior Publication Data

US 2010/0109627 A1    May 6, 2010

(30) Foreign Application Priority Data

Oct. 31, 2008   (JP) .................................. 2008-281524

(51) Int. Cl.
*H03K 3/01*    (2006.01)
(52) U.S. Cl. ................... 327/534; 327/156; 365/189.09; 365/226; 323/322
(58) Field of Classification Search .................. 323/238, 323/241, 247, 322, 351, 267, 270, 282–285; 327/51, 63, 77, 154, 156, 158, 189.09, 534, 327/536, 546, 361; 365/149, 189.09, 206, 365/191, 241, 233.01, 295, 230.08
See application file for complete search history.

(56) References Cited

U.S. PATENT DOCUMENTS

| | | | | |
|---|---|---|---|---|
| 6,363,030 B1 * | 3/2002 | Ooishi | ........................ | 365/233.1 |
| 6,369,624 B1 * | 4/2002 | Wang et al. | ................... | 327/156 |
| 6,484,268 B2 * | 11/2002 | Tamura et al. | ................ | 713/600 |
| 6,524,972 B1 * | 2/2003 | Maeda | ........................ | 438/778 |
| 6,841,983 B2 * | 1/2005 | Thomas | ........................ | 323/322 |
| 7,706,151 B2 * | 4/2010 | Neidorff et al. | ................... | 363/9 |

FOREIGN PATENT DOCUMENTS

JP    10-302492    11/1998

* cited by examiner

*Primary Examiner* — Rajnikant Patel
(74) *Attorney, Agent, or Firm* — Oblon, Spivak, McClelland, Maier & Neustadt, L.L.P.

(57) ABSTRACT

A power circuit includes a reference potential circuit, a step-up circuit, and a conversion circuit. The reference potential circuit generates a reference potential. The step-up circuit generates a desired internal potential by stepping up a power supply potential. The step-up circuit includes a comparison circuit, a differential amplifier circuit, and a switch element. The comparison circuit outputs the result of comparison between a potential and the reference potential. The differential amplifier circuit is turned on or off by the operation control signal. The switch element performs on/off control according to the operation control signal and resets the output potential of the differential amplifier circuit. The conversion circuit converts the of the operation control signal so as to make longer the on period of the differential amplifier circuit and the off period of switch element.

20 Claims, 16 Drawing Sheets

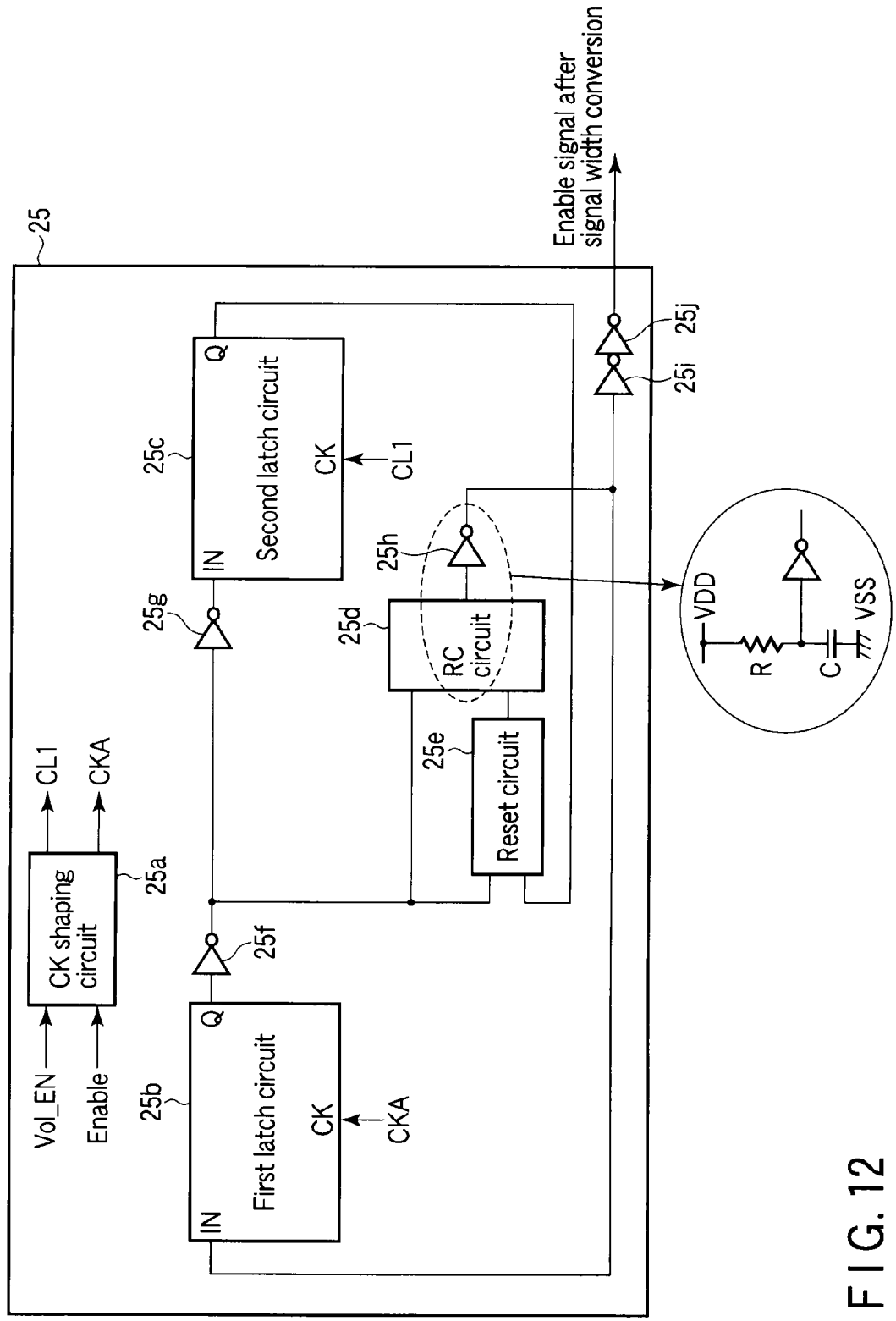
F I G. 12

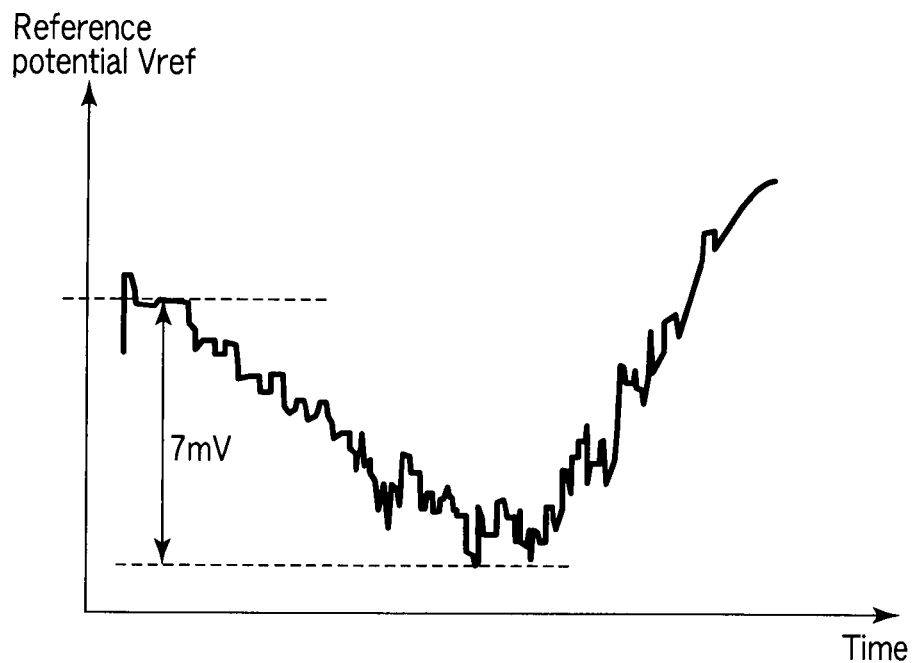
F I G. 14A
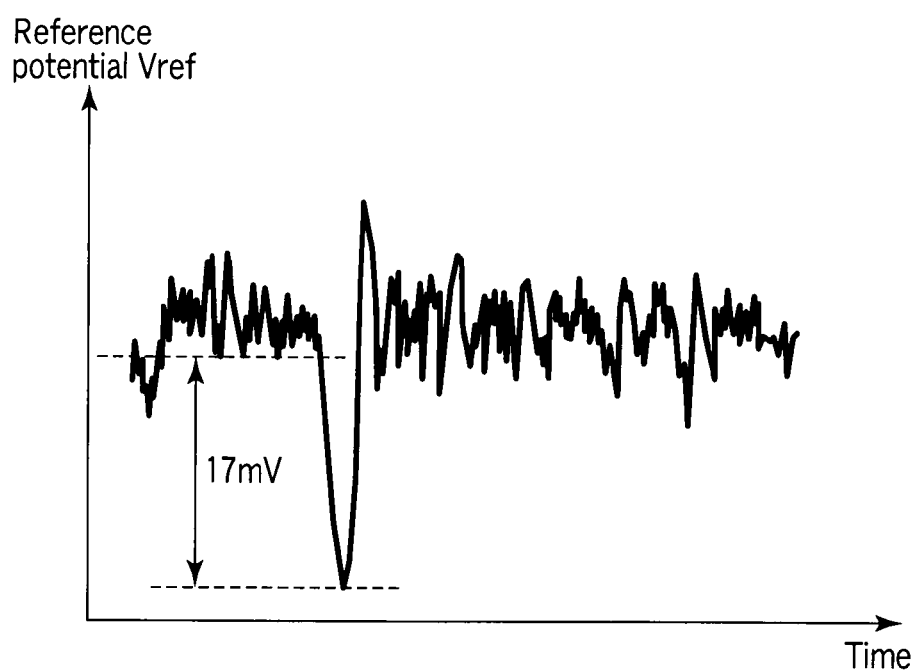
F I G. 14B

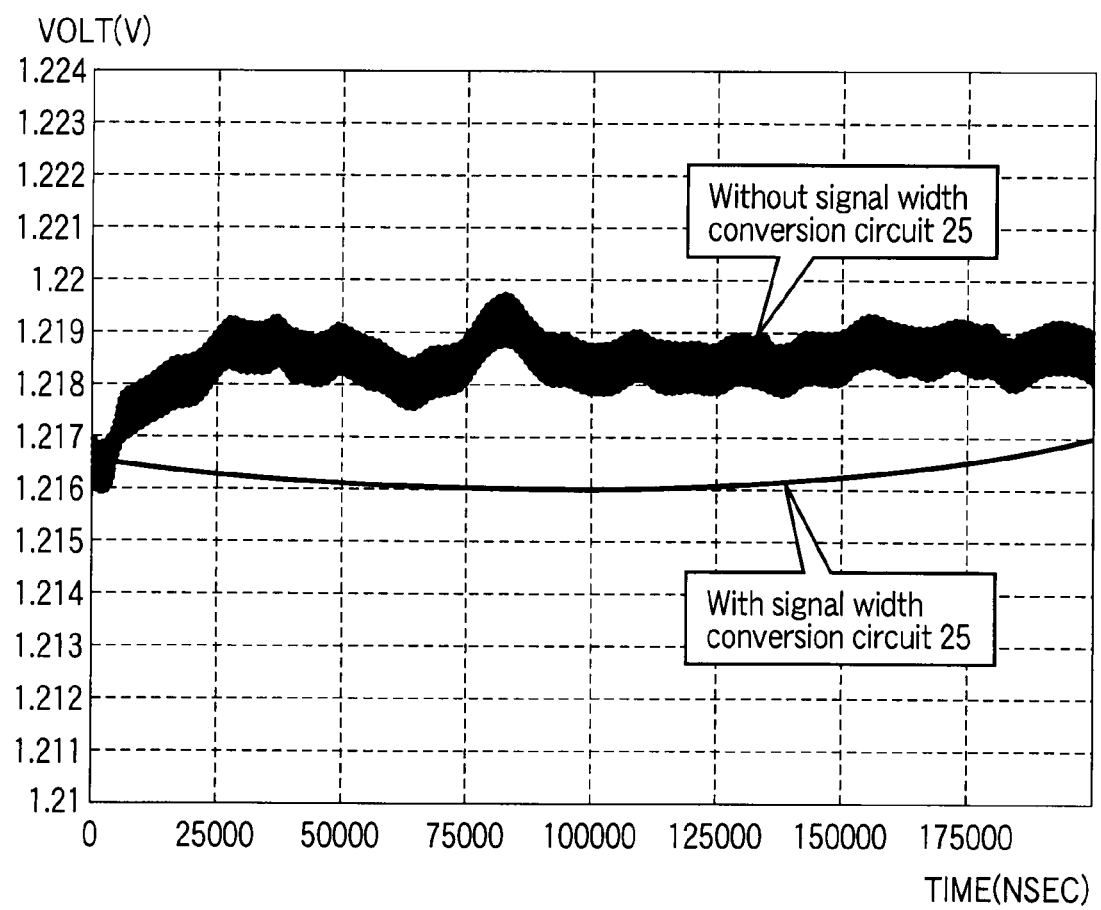
F I G. 15

POWER CIRCUIT INCLUDING STEP-UP CIRCUIT AND STABILIZING METHOD THEREOF

CROSS-REFERENCE TO RELATED APPLICATIONS

This application is based upon and claims the benefit of priority from prior Japanese Patent Application No. 2008-281524, filed Oct. 31, 2008, the entire contents of which are incorporated herein by reference.

BACKGROUND OF THE INVENTION

1. Field of the Invention

This invention relates to a power circuit and a stabilizing method which are used mainly in generating internal potentials in an LSI (Large-Scale Integrated circuit).

2. Description of the Related Art

Recent large-scale integrated circuits generally require a multilevel power supply which has different voltage values, such as 3V, 5V, and 10V, inside the circuit. To meet the requirement for such a multilevel power supply, a plurality of power supplies differing in voltage value have been generated outside the LSI and supplied to the LSI.

In recent years, however, it has been often needed to use a single power supply as a power supply which supplies power to an LSI, particularly to a NOR and a NAND flash memory, a nonvolatile memory, and generate a multilevel power supply inside the LSI. This has been described in Jpn. Pat. Appln. KOKAI Publication No. 10-302492. Furthermore, recently, there have been strong demands toward battery-powered LSIs for use in easy-to-carry mobile devices and further toward lower-voltage operations and less-power consumption.

BRIEF SUMMARY OF THE INVENTION

A power circuit according to an aspect of the invention includes, a reference potential circuit which generates a reference potential;

a step-up circuit which generates an internal potential by stepping up a power supply potential and which includes
 a comparison circuit which outputs an operation control signal indicating the result of comparison between a potential corresponding to the internal potential and the reference potential,
 a differential amplifier circuit which is turned on or off by the operation control signal and uses the reference potential as one input, and
 a switch element which performs on/off control according to the operation control signal and resets an output potential of the differential amplifier circuit; and
 a signal width conversion circuit which converts a signal width of the operation control signal so as to make longer an on period of the differential amplifier circuit and an off period of the switch element.

A stabilizing method of a power circuit according to an aspect of the invention includes, a reference potential circuit which generates a reference potential and a step-up circuit which generates an internal potential by stepping up a power supply potential, the method comprising:

outputting an operation control signal indicating the result of comparison between a potential corresponding to the internal potential and the reference potential;

turning on or off a differential amplifier circuit based on the operation control signal, the differential amplifier circuit using the reference potential as one input;

resetting the output potential of the differential amplifier circuit based on the operation control signal by performing on/off control of a switch circuit; and making longer an on period of the differential amplifier circuit and an off period of the switch element or making the differential amplifier circuit normally on and the switch element normally off.

BRIEF DESCRIPTION OF THE SEVERAL VIEWS OF THE DRAWING

FIG. 12 shows an internal configuration of the signal width conversion circuit in the power circuit;

FIGS. 14A and 14B are diagrams to explain the cause of a fluctuation in reference potential Vref;

FIG. 15 is a diagram showing the result of suppressing a fluctuation in reference potential Vref at the power circuit of the first embodiment;

DETAILED DESCRIPTION OF THE INVENTION

Figure 1:
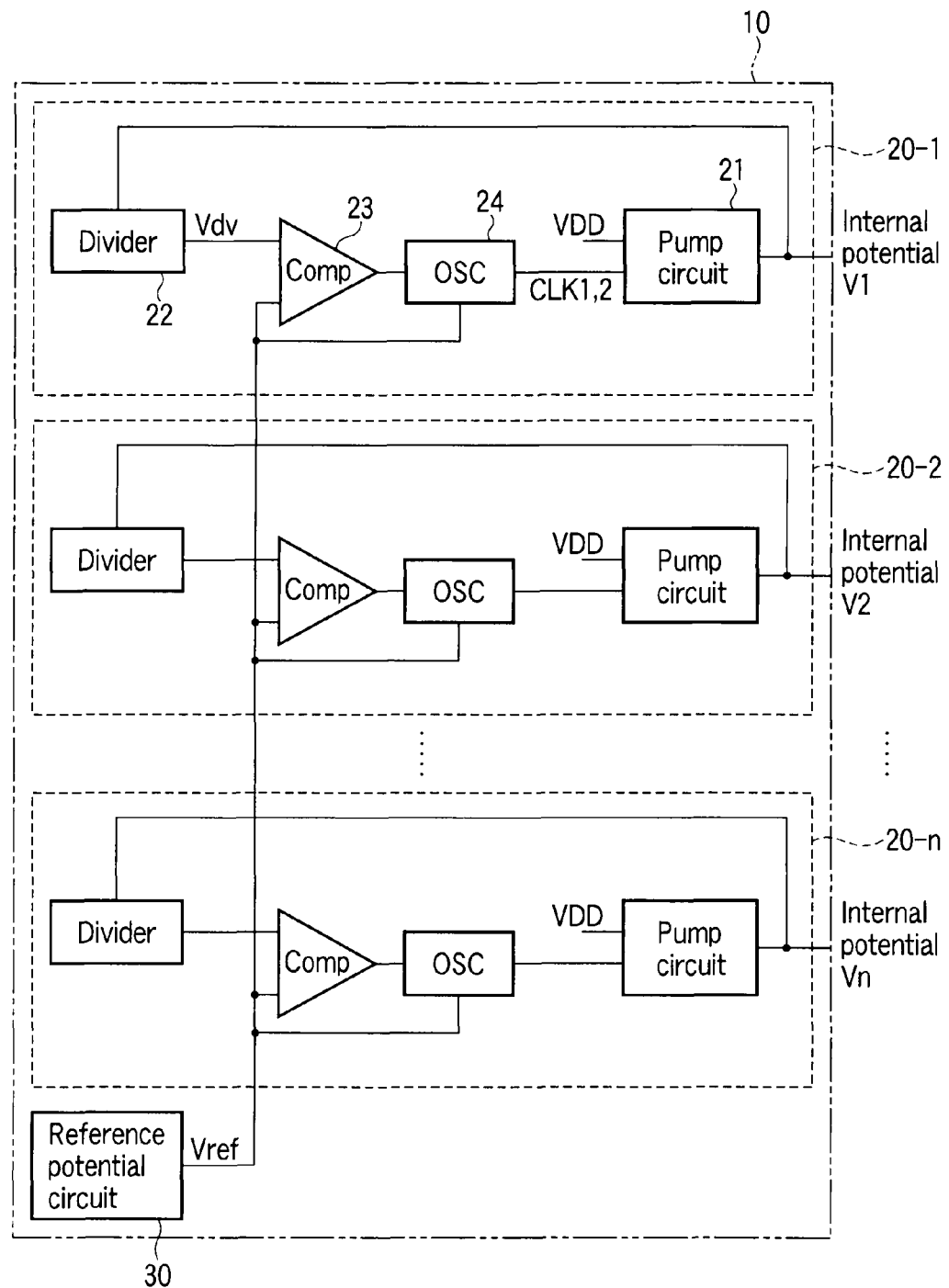
FIG. 1 is a circuit diagram of a conventional power circuit.

Hereinafter, referring to the accompanying drawings, embodiments of the invention will be explained. A general configuration of a power circuit will be explained with reference to FIGS. 1 to 6. Then, a first embodiment of the invention will be explained. In the explanation, like parts are shown by like reference numerals throughout FIGS. 1 to 6.

<Overall Configuration>

First, a general configuration of a power circuit will be explained with reference to FIG. 1. FIG. 1 is a block diagram of a power circuit 10 which generates a multilevel power supply inside an LSI. As shown in FIG. 1, the power circuit 10 includes a plurality of (an n number of: n is a natural number)

internal step-up (booster) circuits 20-1 to 20-n and a reference potential circuit 30. Each of the internal step-up circuits 20-1 to 20-n is for stepping up a power supply potential VDD of the LSI to generate different internal potentials V1 to Vn. The reference potential circuit 30 is composed of, for example, a BGR (Band Gap Reference) circuit. The reference potential circuit 30 generates a reference voltage Vref from the power supply potential VDD of the LSI and supplies the reference voltage Vref to each of the internal step-up circuits 20-1 to 20-n.

<Circuit Configuration of Reference Potential Circuit 30>

Figure 2:
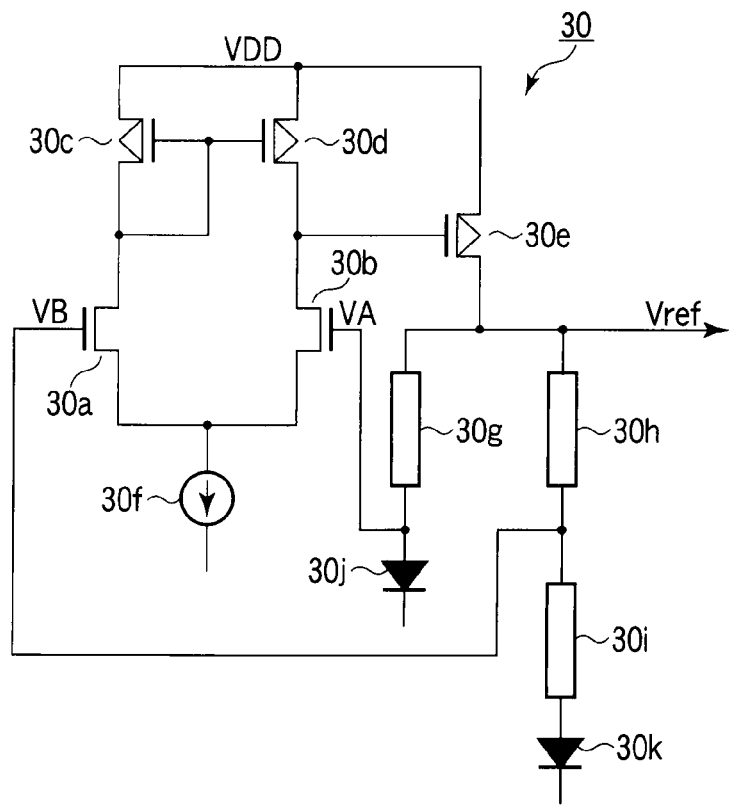
FIG. 2 is a circuit diagram of a reference potential circuit in the power circuit.

FIG. 2 shows a circuit configuration of the reference potential circuit 30. As shown in FIG. 2, the reference potential circuit 30 includes n-channel transistors 30c and 30d which perform differential amplification, p-channel transistors 30c and 30d functioning as loads on the transistors 30a and 30b respectively, a p-channel transistor 30e to whose gate the differential output is applied, a constant current source 30f, resistances 30g, 30h, 30i, a diode 30j, and a diode unit 30k composed of a series connection of a plurality of diodes. The reference potential circuit 30 outputs a temperature-compensated reference potential Vref.

To return to FIG. 1, the internal step-up circuit 20-1 will be explained. The internal step-up circuit 20-1 includes a pump circuit 21, a divider 22, a comparator (comparison circuit) 23, and an oscillator 24. Since the same holds true for the remaining internal step-up circuits 20-2 to 20-n, an explanation of them will be omitted.

<Circuit Configuration of Pump Circuit 21>

Figure 3:
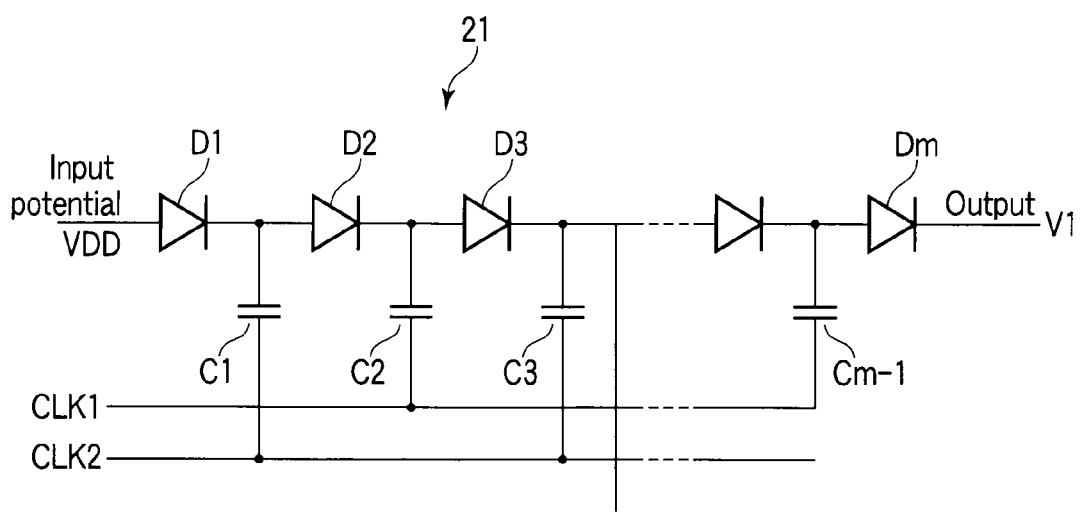
FIG. 3 is a circuit diagram of a pump circuit in the power circuit.

Pump circuit 21 will be explained with reference to FIG. 3. FIG. 3 is a circuit diagram of pump circuit 21. Pump circuit 21, which is a Dickson-circuit-type charge pump circuit, steps up power supply potential VDD on the basis of clocked signals CLK1, CLK2 input from oscillator 24, thereby generating an internal potential V1. Clocked signal CLK2 is a logical inversion signal of clocked signal CLK1.

As shown in FIG. 3, pump circuit 21 includes a plurality of (an m number of: m is a natural number) diodes D1 to Dm and an m-1 number of capacitors C1 to Cm-1 one end of each of which is connected between adjacent diodes. Power supply voltage VDD of the LSI is input to diode D1 at the input stage. Clocked signal CLK1 is input to the other end of each of the capacitors at even-numbered stages (C2, C4, . . . ). Clocked signal CLK2 is input to the other end of each of the capacitors at odd-numbered stages (C1, C3, . . . ).

With such a configuration, power supply voltage VDD input to diode D1 is stepped up each time it passes through each diode, with the result that a desired internal potential V1 is output from diode Dm at the output stage. Internal voltage V1 generated by the pump circuit 21 is input to divider 22.

<Divider 22>

Divider 22, which is a circuit for scaling down internal potential V1 input from pump circuit 21 (e.g., a resistance voltage divider), outputs a scaled-down (divided) potential Vdv to comparator 23.

<Circuit Configuration of Comparator 23>

Figure 4:
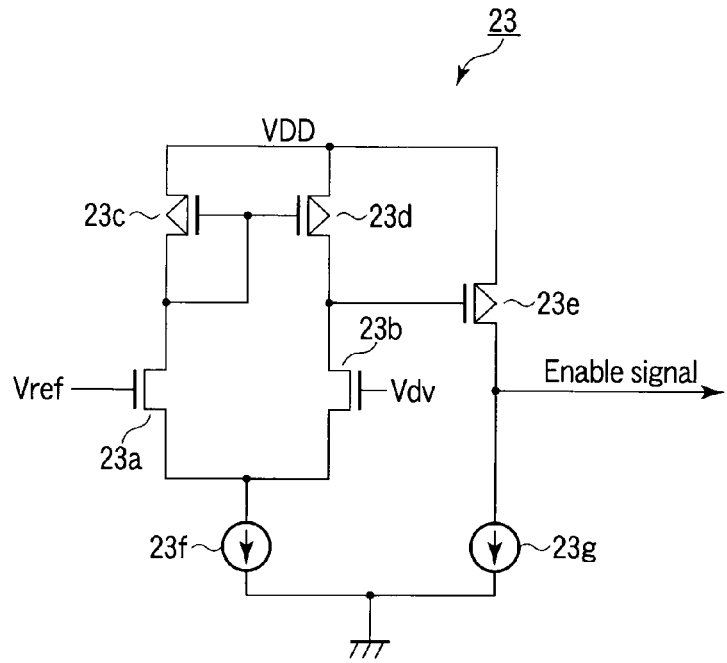
FIG. 4 is a circuit diagram of a comparator in the power circuit.

Next, comparator 23 will be explained with reference to FIG. 4. FIG. 4 is a circuit diagram of comparator 23. As shown in FIG. 4, comparator 23 includes n-channel transistors 23a, 23b, p-channel transistors 23c, 23d, a p-channel transistor 23e to whose gate a differential output is applied, and constant current sources 23f, 23g. Transistors 23a and 23b constitute a differential amplifier circuit to which a reference potential Vref and an output potential Vdv are input as a differential input. That is, output potential Vdv of divider 22 is applied to the gate of transistor 23a functioning as a differential amplifier circuit. Reference potential Vref is applied to the gate of transistor 23b. The output of transistor 23e is output as an Enable signal. That is, comparator 23 compares potential Vdv input from divider 22 and reference voltage Vref input from reference potential circuit 30 and outputs an operation control signal (Enable signal) representing the comparison result to oscillator 24. Specifically, if output potential Vdv of divider 22 is lower than reference potential Vref, a high-level Enable signal is output, whereas if output potential Vdv of divider 22 is higher than reference potential Vref, a low-level Enable signal (hereinafter, sometimes referred to as Disable signal) is output.

<Circuit Configuration of Oscillator 24>

Figure 5:
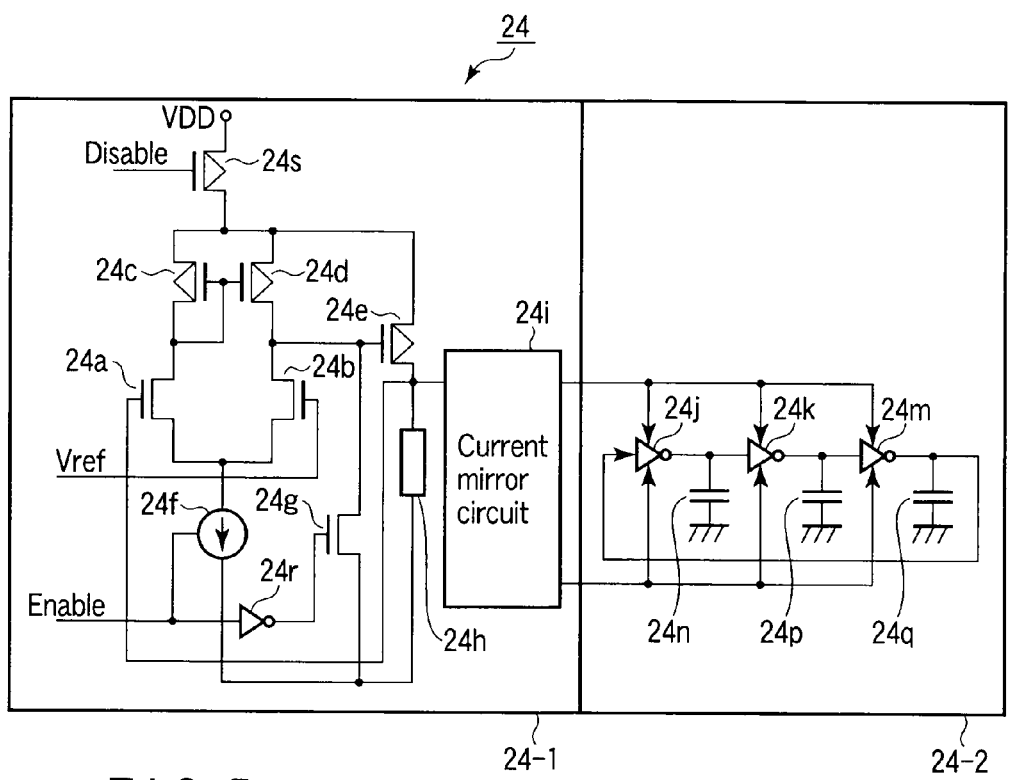
FIG. 5 is a circuit diagram of an oscillator in the power circuit.

Next, oscillator 24 will be explained with reference to FIG. 5. Oscillator 24 generates clocked signals CLK1 and CLK2 supplied to pump circuit 21. The on/off operation of oscillator 24 is controlled according to the level of the Enable signal input from comparator 23. FIG. 5 is a circuit diagram of oscillator 24. As shown in FIG. 5, oscillator 24 includes a reference current generator circuit 24-1 and a ring oscillation circuit 24-2.

Reference current generator circuit 24-1 includes a differential amplifier circuit, a p-channel transistor 24e, a constant current source 24f, an inverter 24r, an n-channel transistor 24g, a resistance 24h, a current mirror circuit 24i and a p-channel transistor 24s for a switch. The differential amplifier circuit includes n-channel transistors 24a, 24b and p-channel transistors 24c, 24d. The p-channel transistor 24e to whose gate a differential output is applied. The constant current source 24f the on/off operation of which is controlled according to the level of the Enable signal input from comparator 23. The inverter 24r which inverts the Enable signal input from comparator 23. The n-channel transistor 24g is turned on or turned off according to the level of the Disable signal output from the inverter 24r. The current mirror circuit 24i duplicates the current flowing between the source and drain of transistor 24e.

The gate of transistor 24a is connected to the connection of the drain of transistor 24e and resistance 24h. The gate of transistor 24b is connected to the output terminal of reference potential circuit 30. That is, the on/off operation of the differential amplifier circuit in reference current generator circuit 24-1 is controlled by the Enable signal. The differential amplifier circuit takes in reference potential Vref as one input and the potential between the terminals of resistance 24h as the other input. Transistor 24g, which is turned on or off according to the Disable signal, functions as a switch element that resets the output potential of the differential amplifier circuit. Transistor 24s functions as a transistor for a switch. That is, transistor 24s functions on transistor 24c and transistor 24d as flowing-through current not flowing by being turned to off according to the level of the Disable signal given to transistor 24s gate.

When the Enable signal supplied from comparator 23 is high, reference current generator circuit 24-1 configured as described above generates a reference current (current flowing between the source and drain of transistor 24e) corresponding to reference potential Vref. The reference current is duplicated by current mirror circuit 24i and output to ring oscillation circuit 24-2.

Ring oscillation circuit 24-2 includes three inverters 24j, 24k, 24m series-connected in a ring and three capacitors 24n, 24p, 24q each connected between the corresponding junction of adjacent inverters and the ground. In ring oscillation circuit 24-2 configured as described above, the reference current is supplied from current mirror circuit 24i to the individual inverters 24*j*, 24*k*, 24*m*, which then operate, thereby generating clocked signals CLK1 and CLK2 supplied to pump circuit 21.

<Operation of Internal Step-up Circuit 20-1>

The operation of internal step-up circuit 20-1 in power circuit 10 configured as described above will be explained with reference to a timing chart in FIG. 6. FIGS. 6A to 6D are timing chart for an output voltage of pump circuit 21 (FIG. 6A), an output voltage of divider 22 (FIG. 6B), an output signal of comparator 23 (FIG. 6C), and a pulse signal of oscillator 24 (FIG. 6D).

When output voltage Vdv of divider 22 is lower than reference potential Vref, the Enable signal output from comparator 23 goes high (see FIGS. 6B and 6C) and oscillator 24 outputs clocked signals CLK, CLK2 to pump circuit 21. Accordingly, internal potential V1 generated by pump circuit 21 rises successively (see FIG. 6A), with the result that output voltage Vdv of divider 22 rises gradually (FIG. 6B).

Figures 6A, 6B, 6C, 6D:
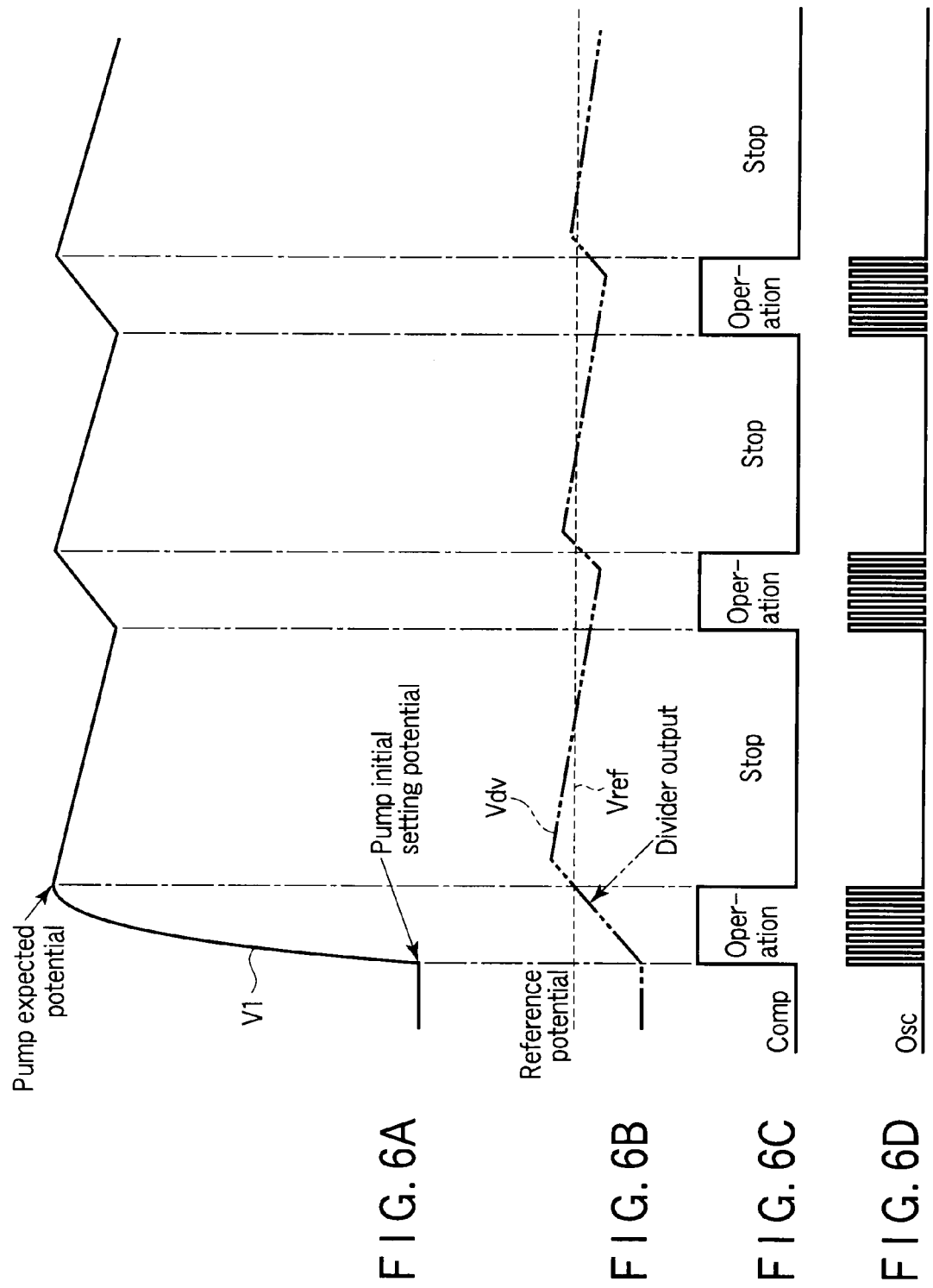
FIGS. 6A to 6D are timing chart to explain the operation of the power circuit.

Then, when voltage Vdv exceeds reference potential Vref, the Enable signal from comparator 23 goes low (FIG. 6C) and oscillator 24 stops the operation and therefore stops outputting clocked signals CLK1, CLK2 (FIG. 6D). When clocked signals CLK1, CLK2 have gone off, the step-up operation of pump circuit 21 stops, with the result that internal potential V1 drops gradually and therefore output voltage Vdv of divider 22 also falls gradually. Then, when voltage Vdv has dropped below reference voltage Vref, the Enable signal from comparator 23 goes high again, causing the step-up operation of pump circuit 21 to start again, which keeps internal potential V1 at a desired value. From this point on, the aforementioned operation is repeated.

As described above, in power circuit 10, a series of operations, the step-up and stop of power supply potential VDD, are repeated by the individual internal step-up circuits 20-1 to 20-n, thereby generating internal potentials V1 to Vn. Since LSIs for use in recent mobile devices are required to consume less power, the current draw is limited by stopping (shutting down) the current flowing in a nonoperational circuit at the time when the step-up operation of pump circuit 21 is stopped to reduce the standby currents as much as possible when the LSI is not operating. So far, the configuration and operation of the power circuit have been explained. Hereinafter, a first and a second embodiment of the invention will be explained, taking the above configuration into account.

[First Embodiment]

Figure 7:
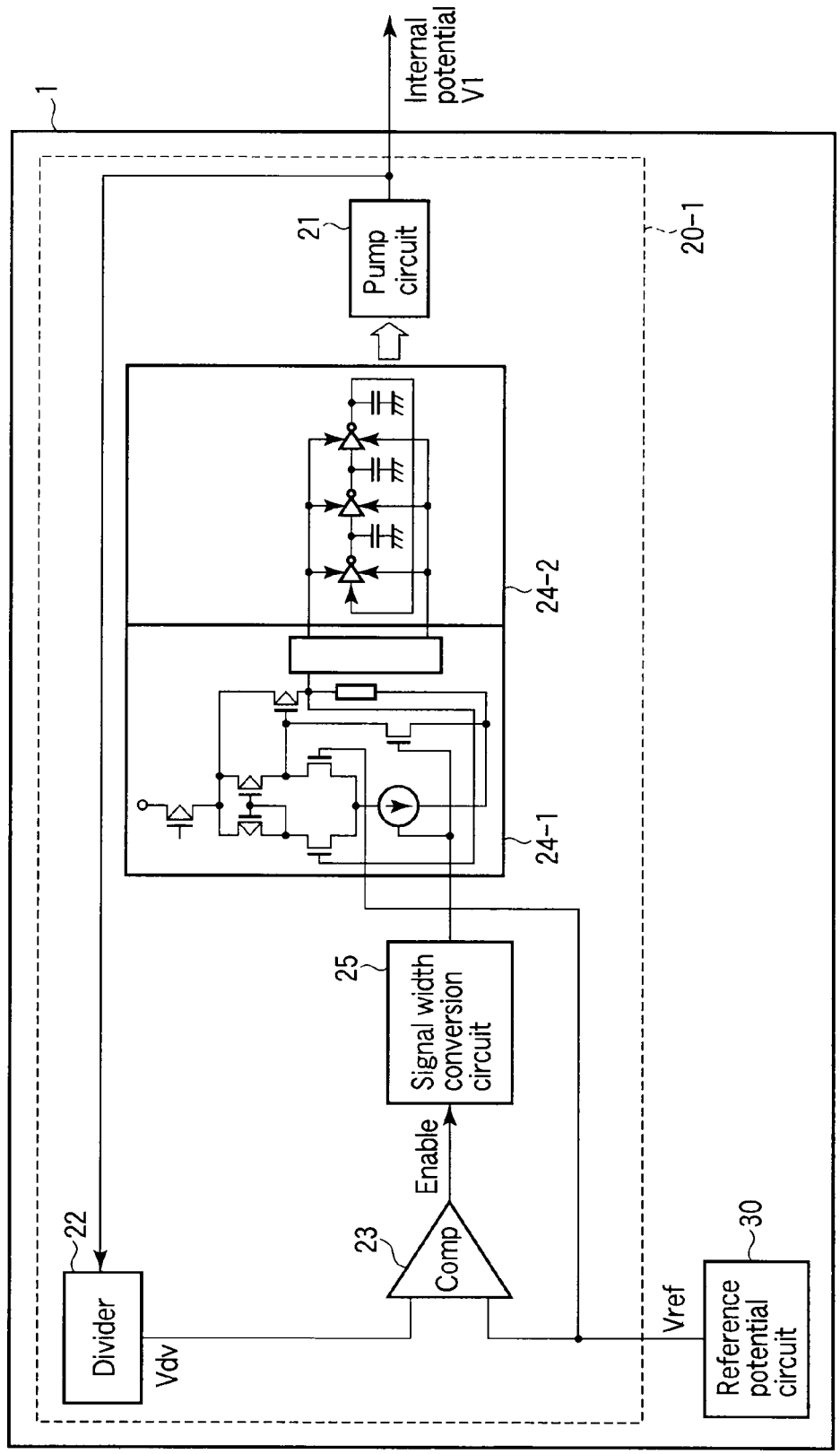
FIG. 7 is a circuit diagram of a power circuit according to a first embodiment of the invention.

Next, a power circuit and a power stabilizing method according to a first embodiment of the invention will be explained. FIG. 7 is a circuit diagram of a power circuit 1 according to the first embodiment. In FIG. 7, the same structural elements as those in FIGS. 1 to 5 are indicated by the same reference numerals and an explanation of them will be omitted. As shown in FIG. 7, the power circuit 1 of the first embodiment differs from the above-described power supply 10 in that a signal width conversion circuit 25 for converting the signal width of an Enable signal is additionally provided behind comparator 23 in each of the internal step-up circuits 20-1 to 20-n (in FIG. 7, internal step-up circuit 20-1 is shown as the representative of the rest). That is, in the configuration of the power circuit 1 of the first embodiment, oscillator 24 is eliminated and a signal width conversion circuit 25 is provided.

Specifically, while in the above-described power circuit 10, the Enable signal output from comparator 23 is supplied directly to constant current source 24*f* and transistor 24*g* of reference current generator circuit 24-1 in oscillator 24, the Enable signal subjected to signal width conversion at signal width conversion circuit 25 is supplied to constant current source 24*f* of reference current generator circuit 24-1 in the power supply 1 of the first embodiment. Then, in the power circuit 1 of the first embodiment, the Disable signal subjected to signal width conversion at signal width conversion circuit 25 is supplied to transistor 24*g*.

Figure 8:
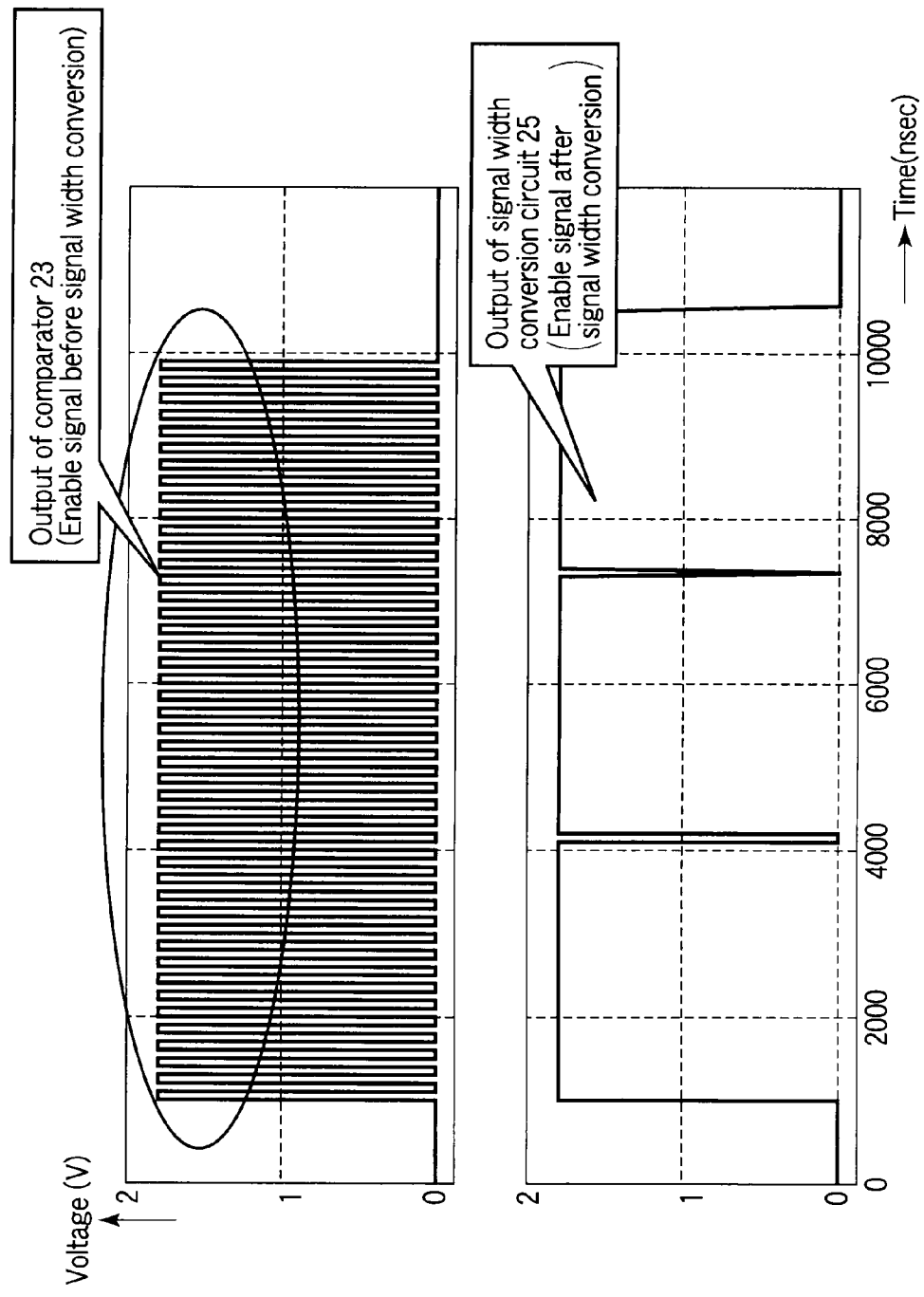
FIG. 8 is a diagram to explain an output signal of a signal width conversion circuit in the power circuit of the first embodiment.

Specifically, as shown in FIG. 8, signal width conversion circuit 25 converts the signal width so as to make longer the high level period of an Enable signal to be output and make shorter the low level period of the Enable signal. In other words, signal width conversion circuit 25 converts the signal width of the Enable signal so that the on period of the differential amplifier circuit in reference current generator circuit 24-1 may become longer. In addition, such a Disable signal as makes the off period longer is supplied via inverter 24*r* to the gate of transistor 24*g* for resetting the output potential of the differential amplifier circuit. That is, signal width conversion circuit 25 converts the signal width so that the off period of transistor 24*g* may become longer.

Providing such a signal width conversion circuit 25 makes it possible to suppress a fluctuation in reference potential Vref caused by a step-up or a stop operation of pump circuit 21. Hereinafter, the reason for this will be explained.

Figure 9:
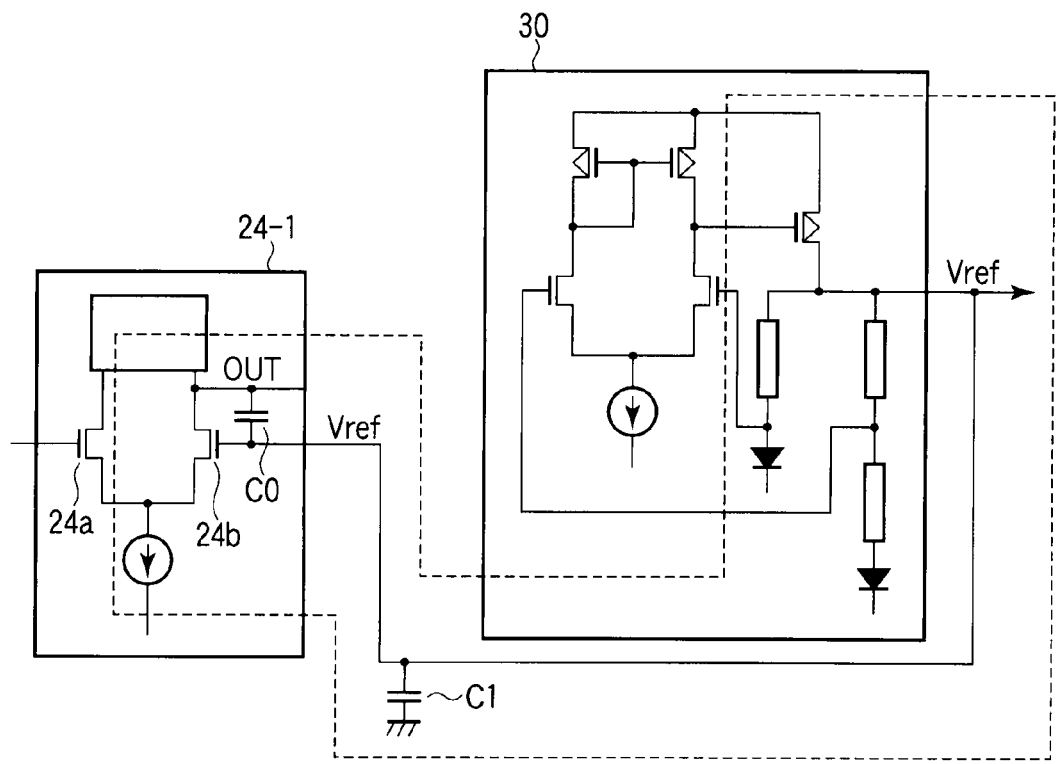
FIGS. 9 to 11 are first to third explanatory diagrams concerning the principle of suppressing a fluctuation in a reference potential Vref.

First, the applicant of the invention has analyzed the cause of a fluctuation in reference potential Vref during the operation of pump circuit 21 and has reached the following conclusion. FIG. 9 is a circuit diagram showing reference potential circuit 30 in internal step-up circuit 20-1 and a part of reference current circuit 24-1 in oscillator 24. During the operation of pump circuit 21, the operation of oscillator 24 (reference current generator circuit 24-1) is turned on or off according to the Enable signal output from comparator 23 as described above.

At this time, transistor 24*g* is turned on or off according to the Disable signal supplied from comparator 23 via inverter 24*r* to the gate of transistor 24*g* for resetting the output potential of the differential amplifier circuit in reference current generator circuit 24-1. It is supposed that a fluctuation in the output potential (the drain potential of transistor 24*b*) of the differential amplifier circuit caused by the on/off operation of transistor 24*g* influences the gate potential of transistor 24*b*, that is, reference potential Vref, by way of the gate-drain overlap capacitance C of the input transistor (transistor 24*b*) of the differential amplifier circuit.

Here, if a fluctuation in the output potential of the differential amplifier circuit is ΔVout, the gate-drain overlap capacitance of the input transistor of the differential amplifier circuit is C0, and the parasitic capacitance of interconnections and the like at reference potential Vref is C1 (see FIG. 2), a fluctuation ΔVref in reference potential caused by the on/off operation of transistor 24*g* is expressed by the following equation (1).

$$\Delta Vref = \{C0/(C0+C1)\} \cdot \Delta Vout \quad (1)$$

Figure 10:
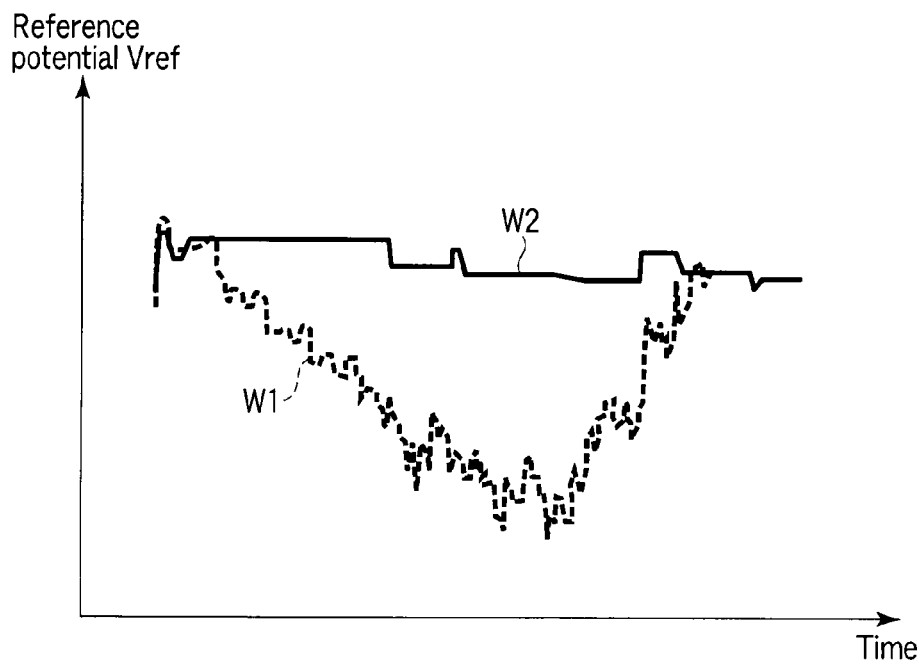

Then, the applicant of the invention performed experiments through a simulation to verify the above supposition. FIG. 10 shows the result of the simulation. In FIG. 10, reference symbol W1 shows fluctuations in reference potential Vref occurred during the operation of "Program" under the Worst condition when the Enable signal output from comparator 23 was supplied directly to reference current generator circuit 24-1 in oscillator 24 (when the differential amplifier circuit and transistor 24*g* were tuned on or off) without providing signal width conversion circuit 25. Reference symbol W2 shows fluctuations in reference potential Vref that occurred during the operation of "Program" under the Worst condition when reference current generator circuit 24-1 was made normally on or normally off (when the differential amplifier circuit was made normally on and transistor 24g was made normally off).

As shown in FIG. 10, it is seen that a fluctuation in reference potential Vref has been improved remarkably by eliminating the on/off operation of the differential amplifier circuit and transistor 24g in reference current generator circuit 24-1. That is, the supposition that the on/off operation of the differential amplifier circuit and transistor 24g is the cause of a fluctuation in reference potential Vref has been determined to be correct.

Figure 11:
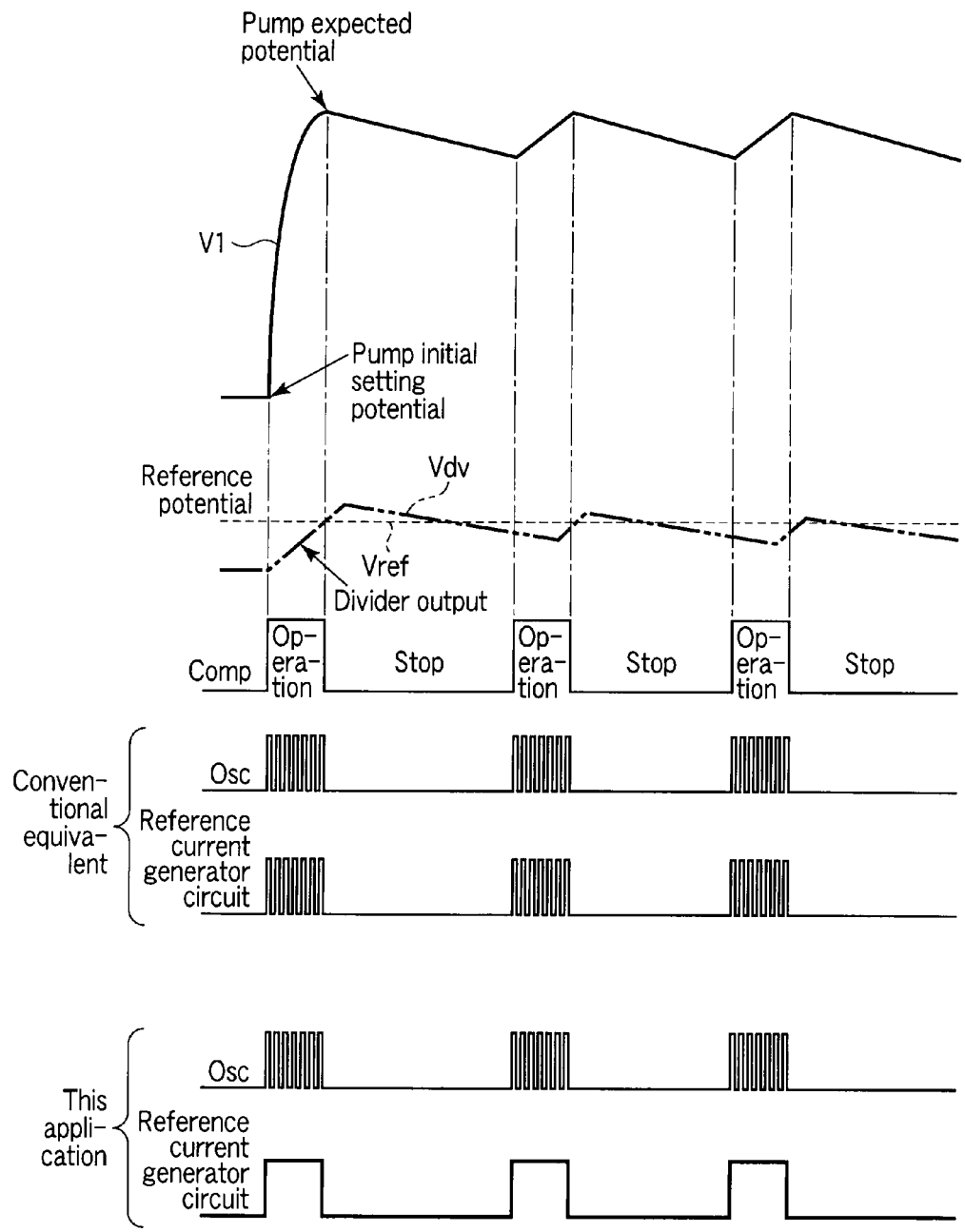

On the basis of the result of the experiment, the applicant of the invention has come to the conclusion that the on/off operation of the differential amplifier circuit and transistor 24g in reference current generator circuit 24-1 is the cause of a fluctuation in reference potential Vref. Therefore, the applicant has proposed a method of suppressing a fluctuation in reference potential Vref by making the differential amplifier circuit normally on and transistor 24g normally off during the operation of pump circuit 21 to eliminate the on/off operation in this application, whereas the differential amplifier circuit and transistor 24g in reference current generator circuit 24-1 repeated the on/off operation during the operation of pump circuit 21 in a conventional equivalent as shown in FIG. 11.

As described above, the on/off operation of the differential amplifier circuit and transistor 24g in reference current generator circuit 24-1 is the cause of a fluctuation in reference potential Vref. From this, it is easily seen that the normally on state or normally off state can be approached practically by not only eliminating the on/off operation to make the differential amplifier circuit normally on and transistor 24g normally off but also making longer the on or off period of the differential amplifier circuit and transistor 24f/g to reduce the number of on/off operations.

Accordingly, in the first embodiment, signal width conversion circuit 25 is caused to convert the signal width so as to make longer the high level period of the Enable signal and make shorter the low level period of the Enable signal (or so as to make longer the on period of the differential amplifier circuit and the off period of transistor 24g in reference current generator circuit 24-1), thereby suppressing a fluctuation in reference potential Vref.

Figure 13:
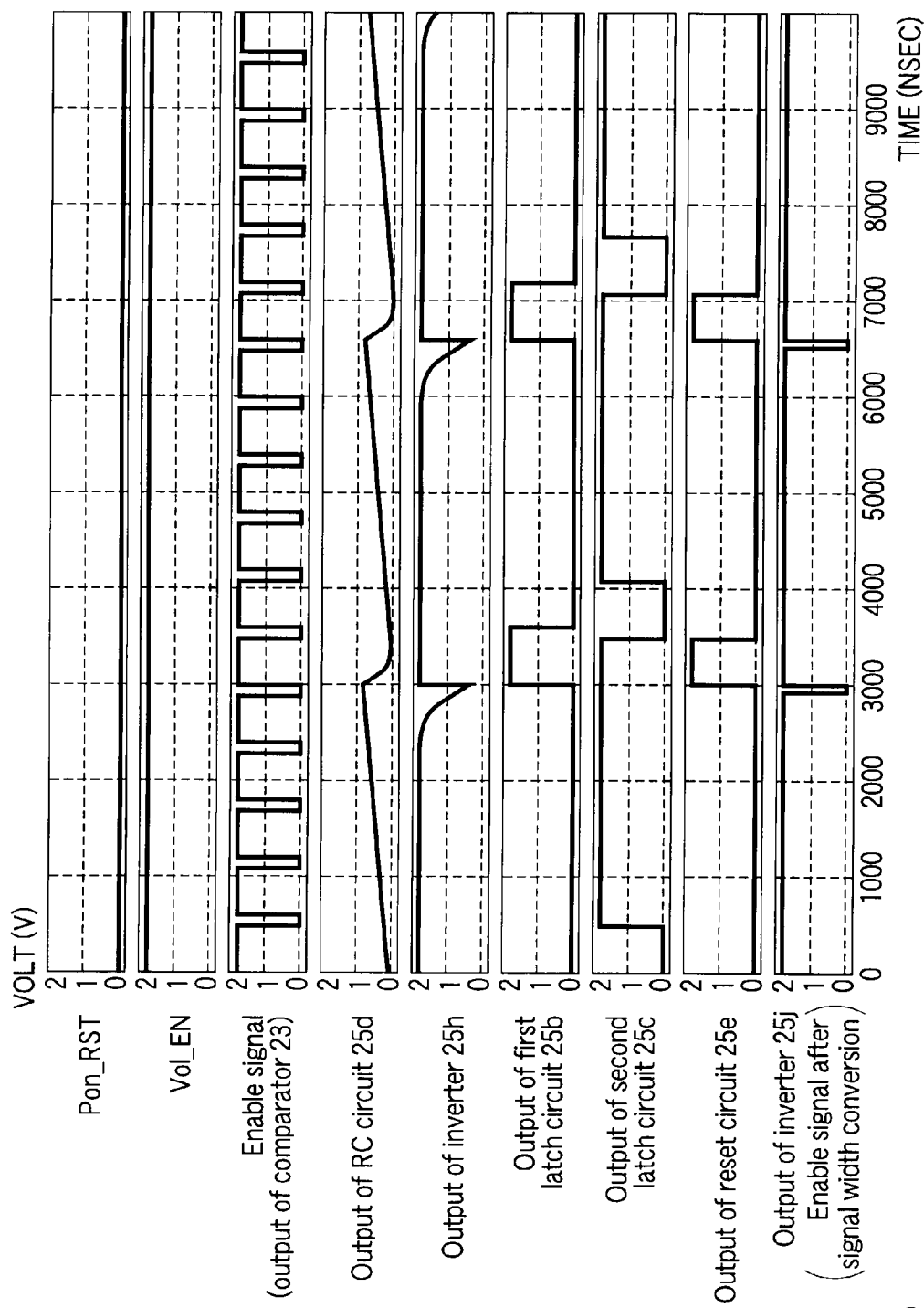
FIG. 13 is a timing chart to explain the operation of the signal width conversion circuit in the power circuit.

Hereinafter, signal width conversion circuit 25 will be explained in detail. FIG. 12 is a block diagram showing an internal configuration of signal width conversion circuit 25. FIG. 13 is a timing chart for various signals in signal width conversion circuit 25.

As shown in FIG. 12, signal width conversion circuit 25 includes a CK shaping circuit 25a, a first latch circuit 25b, a second latch circuit 25c, an RC circuit 25d, a reset circuit 25e, inverters 25f, 25g, 25h, 25i, 25j.

CK shaping circuit 25a takes in an Enable signal output from comparator 23 and an overall operation enable signal Vol_EN of power circuit 1, shapes the Enable signals, and generates clocked signals CKA and CL1. Then, CK shaping circuit 25a outputs clocked signal CKA to the clocked input terminal CK of the first latch circuit 25b and clocked signal CL1 to the clocked input terminal CK of the second latch circuit 25c. The overall operation enable signal Vol_EN is a signal for performing on/off control of the overall operation of power circuit 1. Although not shown in FIG. 12, overall operation enable signal Vol_EN is also input to comparator 23, oscillator 24, and pump circuit 21. Overall operation enable signal Vol_EN remains high during the operation of power circuit 1 as shown in FIG. 13.

The first latch circuit 25b takes in the output signal of inverter 25h as an input. Then, the first latch circuit 25b latches the input signal according to clocked signal CKA and outputs a signal representing the latch result to inverter 25f. According to clocked signal CL1, the second latch circuit 25c latches the output signal of the first latch circuit 25b input via inverters 25f and 25g and outputs a signal representing the latch result to reset circuit 25e. A power-on reset signal Pon_RST of power circuit 1 is input to the second latch circuit 25c. Although not shown in FIG. 12, the power-on reset signal Pon_RST, which is also input to reference potential circuit 30, remains low during the operation of power circuit 1 as shown in FIG. 13.

RC circuit 25d, which is a series circuit of resistance R and capacitance C, outputs a potential corresponding to time constant $\tau=RC$. Reset circuit 25e outputs a reset signal for resetting the output potential of RC circuit 25d on the basis of the output signal of the first latch circuit 25b input via inverter 25f and the output signal of the second latch circuit 25c. The output of RC circuit 25d passes through inverters 25h, 25i, 25j and is supplied as an Enable signal subjected to signal width conversion to oscillator 24 (reference current generator circuit 24-1).

Next, the operation of signal width conversion circuit 25 configured as described above will be explained with reference to a timing chart in FIG. 13. FIG. 13 shows a temporal change in each of overall operation enable signal Vol_EN, power-on reset signal Pon_RST, Enable signal input to signal width conversion circuit 25, output potential of RC circuit 25d, output signal of inverter 25h, output signal of the first latch circuit 25b, output signal of the second latch circuit 25c, output signal (reset signal) of reset circuit 25e, and Enable signal (Enable signal subjected to signal width conversion) output from signal width conversion circuit 25.

First, the output potential of RC circuit 25d transits from Vss to Vdd with time constant $\tau=RC$. Since the output of inverter 25h is Vdd when the output potential of RC circuit 25d has not exceeded the gate threshold value of inverter 25h serving as a load on RC circuit 25d, the output Enable signal goes high. If the output potential of RC circuit 25d has exceeded the gate threshold value of inverter 25h, the output of inverter 25h transits from Vdd to Vss, with the result that the output Enable signal goes low.

Such a change in the output of inverter 25h is latched by the first latch circuit 25b. The result is also input to the second latch circuit 25c, which then latches the input. Since the latch time of the first latch circuit 25b shifts a little relative to that of the second latch circuit 25c according to the difference between clocked signals CKA and CL1, the shift amount is output as a reset signal of reset circuit 25e to RC circuit 25d.

When the reset signal is input, this resets the output potential of RC circuit 25d to Vss. The output potential transits again from Vss to Vdd with time constant $\tau=RC$. Then, as described above, the output Enable signal remains high in the period during which the output potential of RC circuit 25d does not exceed the gate threshold value of inverter 25h. If the output potential of RC circuit 25d has exceeded the gate threshold value of inverter 25h, the output Enable signal goes low. That is, the high level period of the output Enable signal is a period until the output potential of RC circuit 25d has exceeded the gate threshold value of inverter 25h. The high level period of the output Enable signal can be adjusted by adjusting time constant $\tau=RC$ of RC circuit 25d.

<Effect>

With the power circuit and power stabilizing method according to the embodiment, a fluctuation in reference potential Vref can be suppressed by making longer the period during which the output Enable signal is kept high. This effect will be explained in comparison with a conventional power circuit.

In the conventional power circuit 10, when pump circuit 21 was repeating the step-up and stop operations, the following problem arose: reference potential Vref, which was supposed to stabilize, fluctuated. For example, in the case of a system which writes data into a storage unit, such as a memory, (in a "Program" operation) or erases data from the storage unit (in an "Erase" operation), pump circuit 21 in each of internal step-up circuits 20-1 to 20-n in power circuit 10 frequently repeats a step-up operation and a stop operation in the "Program" operation or "Erase" operation. Simulations have shown that reference potential Vref, which is supposed to stabilize, fluctuates in such an operating state as shown in FIGS. 14A and 14B.

FIG. 14A shows a fluctuation in reference potential Vref occurred during a "Program" operation under the Worst condition. FIG. 14B shows a fluctuation in reference potential Vref that occurred during an "Erase" operation under the Worst condition. As shown in FIGS. 14A and 14B, a fluctuation width of about 7 mV maximum was observed in the "Program" operation under the Worst condition and a fluctuation width of about 17 mV maximum was observed in the "Erase" operation under the Worst condition.

The internal potential generated by pump circuit 21 was scaled up at a certain scale factor on the basis of reference potential Vref. Therefore, if reference potential Vref, which is supposed to stabilize, fluctuates as described above, this has a large effect on the internal potentials V1 to Vn output from pump circuits 21 of internal step-up circuits 20-1 to 20-n, causing the problem of preventing the desired internal potentials from being obtained.

However, with the power circuit and power stabilizing method according to the first embodiment, signal width conversion circuit 25 is provided. Specifically, the repetition of the operation as explained in FIG. 13 makes it possible to obtain an Enable signal whose signal width has been converted so as to make the high level period longer (or so as to make longer the on period of the differential amplifier circuit and make shorter the off period of transistor 24g in reference current generator circuit 24-1).

FIG. 15 shows the result of a simulation whereby a fluctuation in reference potential Vref in power circuit 1 (with signal width conversion circuit 25) of the first embodiment was compared with that in the conventional power circuit 10 (without signal width conversion circuit 25). From FIG. 15, it is seen that the power circuit 1 of the first embodiment can suppress a fluctuation in reference potential Vref remarkably as compared with the conventional power circuit 10.

As described above, with the power circuit 1 of the first embodiment, a fluctuation in reference potential Vref can be suppressed and therefore the internal potential to be generated in each of internal step-up circuits 20-1 to 20-n can be stabilized.

[Second Embodiment]

Figure 16:
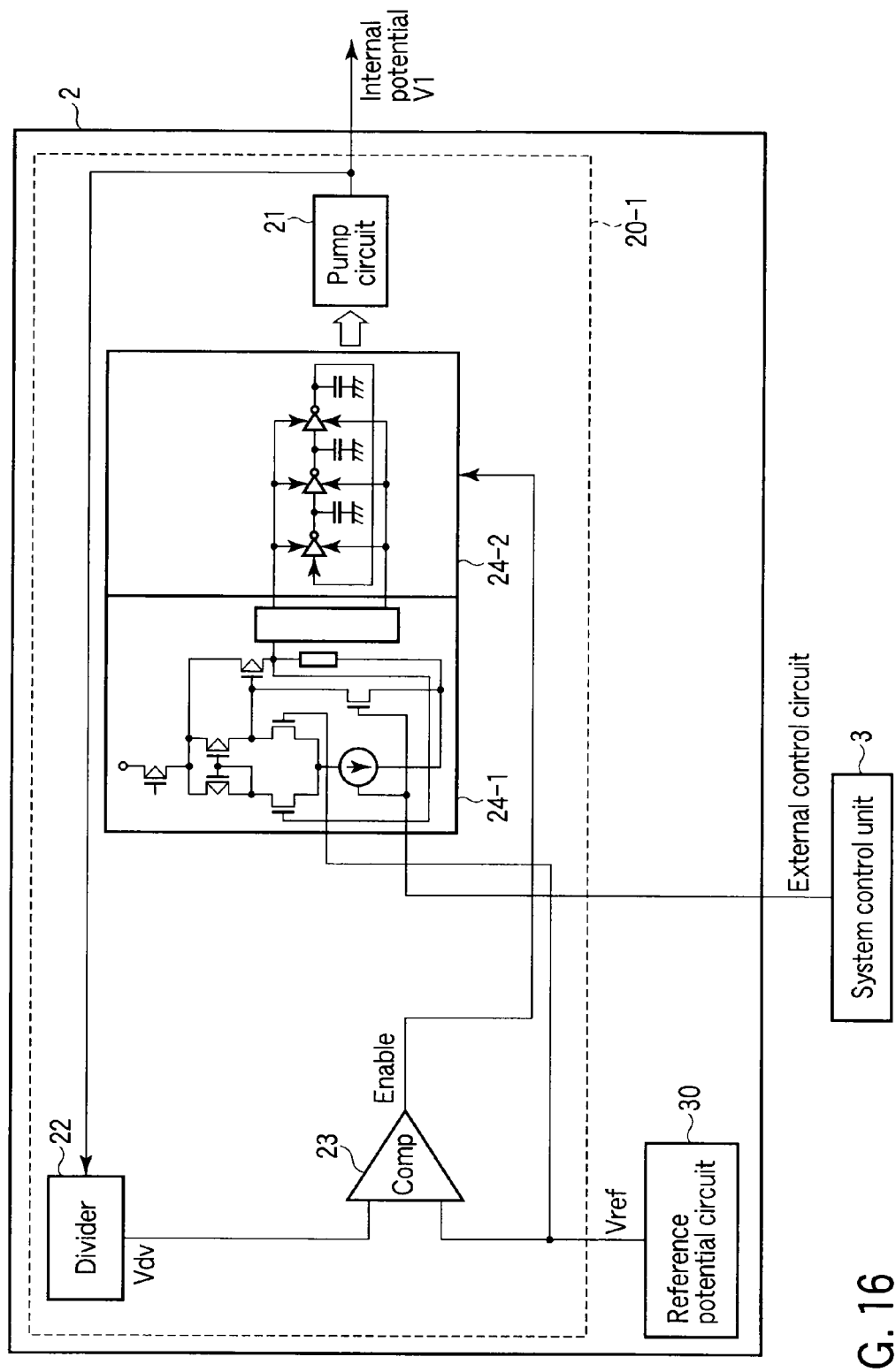
FIG. 16 is a circuit diagram of a power circuit according to a second embodiment of the invention.

Next, a power circuit and a power stabilizing method according to a second embodiment of the invention will be explained. FIG. 16 is a circuit diagram of the power circuit 2 according to the second embodiment. In FIG. 16, the same structural elements as those in FIGS. 1 to 5 indicate the same reference numerals therefore an explanation of them will be omitted. As shown in FIG. 16, in the power circuit 2 of the second embodiment, an external control signal (e.g., a high level signal) as makes the differential amplifier circuit of reference current generator circuit 24-1 normally on and transistor 24g normally off is externally input from a higher-level system control unit 3 and on/off control of the operation of ring oscillation circuit 24-2 is performed by an Enable signal output from comparator 23.

To perform on/off control of the operation of ring oscillation circuit 24-2 by the Enable signal, for example, inverter 24m of ring oscillation circuit 24-2 is replaced with a NAND circuit and the Enable signal of comparator 23 is input to one input terminal of the NAND circuit.

Figure 17A:
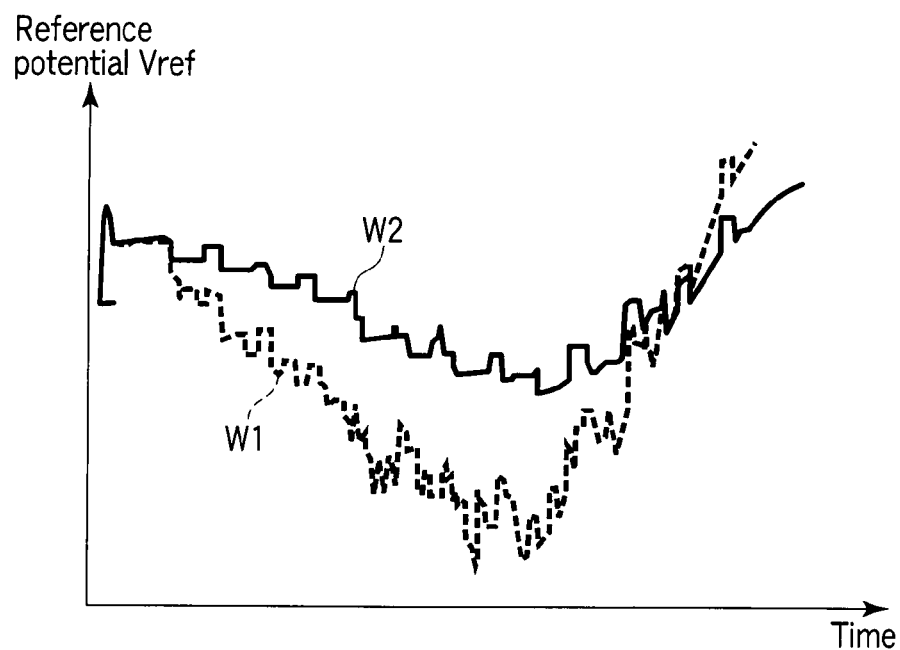
FIGS. 17A and 17B are diagrams showing the result of suppressing a fluctuation in reference potential Vref at the power circuit of the second embodiment.
Figure 17B:
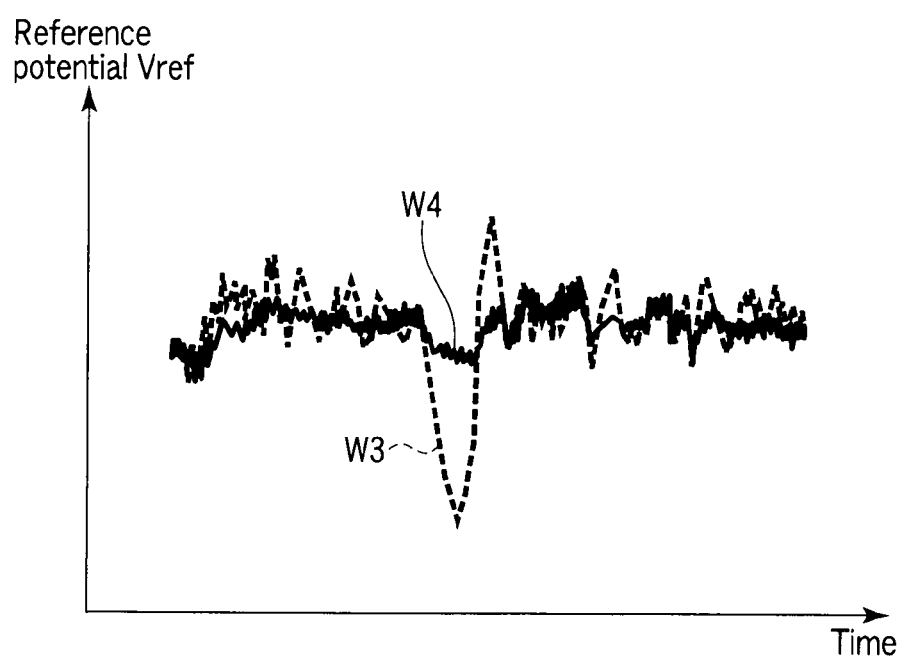

FIGS. 17A and 17B show the results of simulations whereby a fluctuation in reference potential Vref in power circuit 2 of the second embodiment was compared with that in the conventional power circuit 10. In FIG. 17A, reference symbol W1 shows fluctuations in reference potential Vref that occurred during a "Program" operation under the Worst condition when the Enable signal output from comparator 23 was supplied directly to reference current generator circuit 24-1 in oscillator 24, as in the conventional equivalent. Reference symbol W2 shows fluctuations in reference potential Vref that occurred during the "Program" operation under the Worst condition when reference current generator circuit 24-1 was made normally on (when the differential amplifier circuit and transistor 24b were made normally on).

In FIG. 17B, reference symbol W3 shows fluctuations in reference potential Vref that occurred during an "Erase" operation under the Worst condition when the Enable signal output from comparator 23 was supplied directly to reference current generator circuit 24-1 in oscillator 24, as in the conventional equivalent. Reference symbol W2 shows fluctuations in reference potential Vref that occurred during the "Erase" operation under the Worst condition when reference current generator circuit 24-1 was made normally on or normally off. From FIGS. 17A and 17B, it is seen that the power circuit 2 of the second embodiment can suppress a fluctuation in reference potential Vref remarkably as compared with the conventional power circuit 10.

<Effect>

As described above, even with the power circuit and power stabilizing method of the second embodiment, a fluctuation in reference potential Vref can be suppressed and therefore the internal potential to be generated in each of internal step-up circuits 20-1 to 20-n can be stabilized. Moreover, since on/off control of the operation of ring oscillation circuit 24-2 is performed by the Enable signal output from comparator 23, ring oscillation circuit 24-2 can be operated (or pump circuit 21 can be operated) as needed, enabling the power consumption to be suppressed.

<Third Embodiment>

Figure 18:
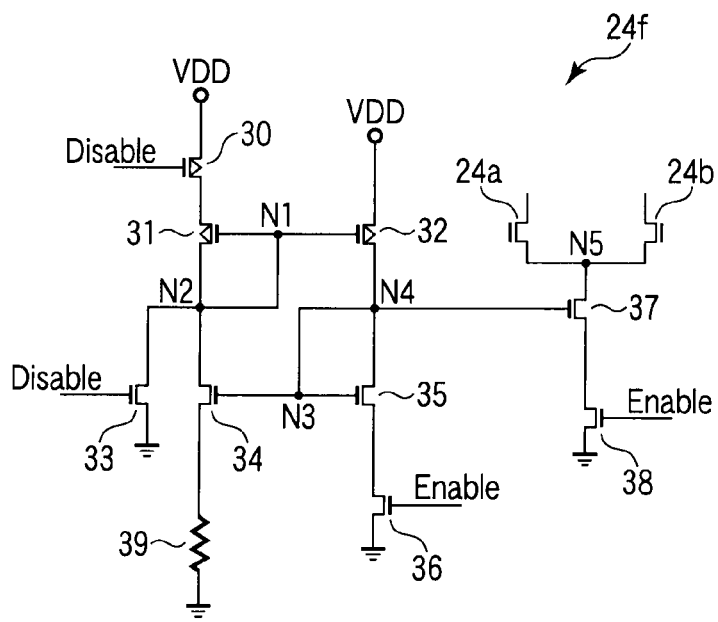
FIGS. 18 and 19 are circuit diagrams of a power circuit according to a third embodiment of the invention.

Next, a power circuit and a power stabilizing method according to a third embodiment of the invention will be explained. FIG. 18 is a circuit diagram of constant current source 24f explained above.

As shown in FIG. 18, constant current source 24f includes p-channel MOS transistors 30 to 32, n-channel MOS transistors 33 to 38, and a resistance element 39. Power supply potential VDD is supplied to one end of the current path of MOS transistor 30. The Disable signal is supplied from signal width conversion circuit 25 to the gate of MOS transistor 30. That is, the Enable signal supplied from signal width conversion circuit 25 is inverted by an inverter (not shown), with the result that a Disable signal is supplied to the gate of MOS transistor 30. Similarly, to the gate of a MOS transistor to which the Disable signal is input, a signal passed through an inverter (not shown) is supplied from signal width conversion circuit 25.

One end of the current path of MOS transistor 31 is connected to the other end of the current path of MOS transistor 30. The other end of the current path of MOS transistor 31 is connected to node N2. The gate of MOS transistor 31 is connected via node N1 to node N2. That is, MOS transistor 31 has its gate and the other end of its current path connected in common.

Power supply potential VDD is supplied to one end of the current path of MOS transistor 32. The other end of the current path of MOS transistor 32 is connected to node N4. The gate of MOS transistor 32 is connected to node N1. That is, at node N1, the gate of MOS transistor 31 and that of MOS transistor 32 are connected in common.

One end of the current path of MOS transistor 33 is connected to node N2. The other end of the current path of MOS transistor 33 is grounded. The Disable signal is supplied to the gate of MOS transistor 33. That is, the potential at nodes N2 and N1 is supplied to one end of the current path of MOS transistor 33.

One end of the current path of MOS transistor 34 and the other end of the current path of MOS transistor 31 are connected in common at node N2. The other end of the current path of MOS transistor 34 is grounded via resistance element 39. Node 3 is connected to the gate of MOS transistor 34.

One end of the current path of MOS transistor 35 and the other end of the current path of MOS transistor 32 are connected in common at node N4. Node 3 is connected to the gate of MOS transistor 35.

One end of the current path of MOS transistor 36 and the other end of the current path of MOS transistor 35 are connected in common. The other end of the current path of MOS transistor 36 is grounded. The Enable signal is supplied to the gate of MOS transistor 36.

One end of the current path of MOS transistor 37 is connected to one end of the current path of each of MOS transistors 24a and 24b functioning as a differential amplifier circuit. Node N4 is connected to the gate of MOS transistor 37. That is, the gates of MOS transistors 34 and 35 and the gate of MOS transistor 37 are connected in common.

One end of the current path of MOS transistor 38 and the other end of the current path of MOS transistor 37 are connected in common. The other end of the current path of MOS transistor 38 is grounded. The Enable signal is supplied to the gate of MOS transistor 38. Here, the Enable signal is made high and the Disable signal is made low.

That is, when a low-level signal is supplied to the gates of MOS transistors 30 to 32, MOS transistors 30 to 32 are turned on. This is because the other end of the current path of MOS transistor 33 is grounded and, when MOS transistor 33 is changed from the on state to the off state, the potential at node N1 is kept at zero potential. As a result, power supply potential VDD supplied to one end of the current path of MOS transistor 30 causes current $I_1$ to flow through MOS transistor 30, 31 and node N2.

Furthermore, since power supply potential VDD is supplied to one end of the current path of MOS transistor 32, current $I_2$ flows through MOS transistor 32 and node N4. Then, the potential at node N4 is supplied to MOS transistors 34 and 35. Accordingly, the current flowing through MOS transistor 34 and that flowing through MOS transistor 35 are the same. That is, current $I_1$=current $I_2$.

Then, the voltage at node N4 is applied to the gate of MOS transistor 37. That is, in MOS transistor 37, too, current $I_1$(=current $I_2$) flows as a constant current source.

Figure 19:
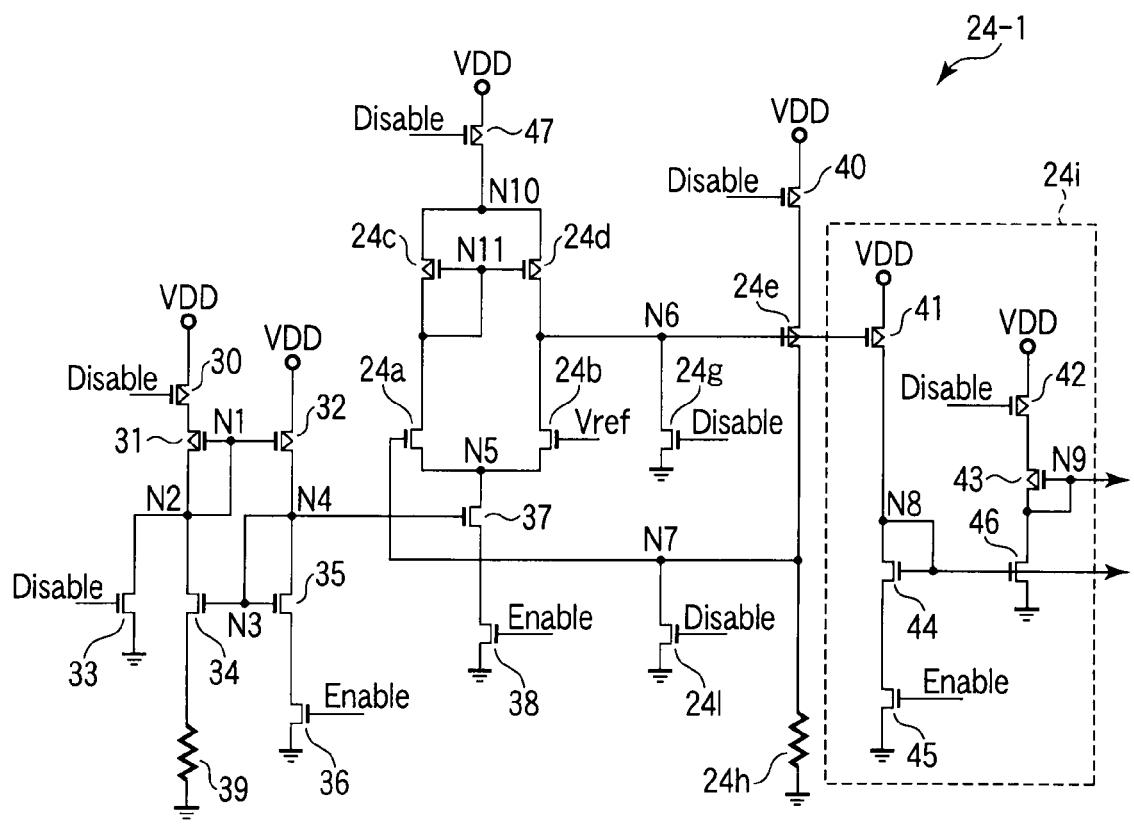

Next, FIG. 19 is a circuit diagram of reference current generator circuit 24-1 explained above. In FIG. 19, an explanation of the same configuration as in FIG. 18, that is, the circuit configuration of the differential amplifier circuit and constant current source 24f will be omitted.

As shown in FIG. 19, reference current generator circuit 24-1 has not only the aforementioned configuration but also a current mirror 24i and a p-channel MOS transistor 24e explained in FIG. 5, a resistance 24h, an n-channel MOS transistor 24g functioning as a switch element, and p-channel MOS transistors 24l, 47.

One end of the current path of MOS transistor 24g is connected to node N6. The other end of the current path of MOS transistor 24g is grounded. The Disable signal is supplied to the gate of MOS transistor 24g.

One end of the current path of MOS transistor 24l is connected to node N7. The other end of the current path of MOS transistor 24l is grounded. The Disable signal is supplied to the gate of MOS transistor 24l.

Power supply potential VDD is supplied to one end of the current path of MOS transistor 40. The Disable signal is supplied to the gate of MOS transistor 40. One end of the current path of MOS transistor 24e and the other end of the current path of MOS transistor 40 are connected in common. The other end of the current path of MOS transistor 24e is connected to node N7. The gate of MOS transistor 24e is connected to node N6. That is, when the potential at node N6 drops below the threshold potential of MOS transistor 24e, this turns on MOS transistor 24e.

One end of resistance 24h and the other end of the current path of MOS transistor 24e are connected in common. The other end of resistance 24h is grounded.

Next, a configuration of current mirror 24i will be explained. Current mirror 24i includes p-channel MOS transistors 41 to 43 and n-channel transistors 44 to 46. The connection between the individual members will be explained.

Power supply potential VDD is supplied to one end of the current path of MOS transistor 41. The other end of the current path of MOS transistor 41 is connected to node N8. Node N6 is connected to the gate of MOS transistor 41.

Power supply potential VDD is supplied to one end of the current path of MOS transistor 42. The Disable signal is supplied to the gate of MOS transistor 42.

One end of the current path of MOS transistor 43 and the other end of the current path of MOS transistor 42 are connected in common. The other end of the current path of and the gate of MOS transistor 43 are connected in common at node N9.

One end of the current path of and the gate of MOS transistor 44 are connected in common at node N8. One end of the current path of MOS transistor 45 and the other end of the current path of MOS transistor 44 are connected in common. The other end of the current path of MOS transistor 45 is grounded. The Enable signal is supplied to the gate of MOS transistor 45.

One end of the current path of MOS transistor 46 is connected to node N9. The other end of MOS transistor 46 is grounded. The gate of MOS transistor 46 is connected to node N8. As shown in FIG. 19, the potential at each of node N8 and node N9 is supplied to reference current generator circuit 24-2.

Finally, MOS transistor 47 will be explained. Power supply potential VDD is supplied to one end of the current path of MOS transistor 47. The other end of the current path of MOS transistor 47 is connected to node N10. The Disable signal is supplied to the gate of MOS transistor 47.

Specifically, since MOS transistor 47 is turned on, current flows to node N10 via MOS transistor 47. At this time, suppose the potential at node N11 is at a certain voltage that turns on MOS transistors 24c and 24d. Then, current from node N10 flows to MOS transistors 24c and 24d. Since reference potential Vref is applied to the gate of MOS transistor 24b, MOS transistor 24b is turned on. Here, suppose, reference potential Vref is higher than the potential at node N7, that is, the voltage applied to the gate of MOS transistor 24a. Then, the current flowing through MOS transistor 24b is larger than that flowing through MOS transistor 24a. That is, the potential at node N6 is grounded via MOS transistors 37 and 38. As a result, the potential at node N6 goes toward the zero potential.

Then, since the potential at the gate of MOS transistor 24e goes toward the zero potential, MOS transistor 24e is turned on, with the result that current flows from the power-supply-potential-supplied MOS transistor 40 to resistance 24h. Then, as the value of the voltage applied to the gate of MOS transistor 24e gets closer to the zero potential, the current flowing through MOS transistor 24e becomes larger. That is, the potential at node N7 becomes higher.

As a result, the voltage applied to the gate of MOS transistor 24a becomes higher and, at a certain time, becomes as high as reference potential Vref. At this time, the current flowing through MOS transistors 24c, 24a becomes equal to that flowing through MOS transistors 24d, 24b. The amount of current at node N5 is twice the amount of current flowing through, for example, MOS transistors 24a, 24c.

At this time, the potential at node N6 is kept constant and is supplied to the gate of MOS transistor 41. That is, the same current as that flowing through, for example, MOS transistors 24a, 24c flows through MOS transistors 41, 44, 45.

As a result, a value obtained by subtracting the threshold value of MOS transistor 46 from the potential at node N8 is set as the potential at node 9. Here, if the potential at node N9 is lower than the threshold value of MOS transistor 43, MOS transistor 43 is turned on, causing current to flow through MOS transistors 42, 43, 46.

Then, the potential at node N8 and that at node N9 are supplied to ring oscillation circuit 24-2.

[Fourth Embodiment]

Figure 20:
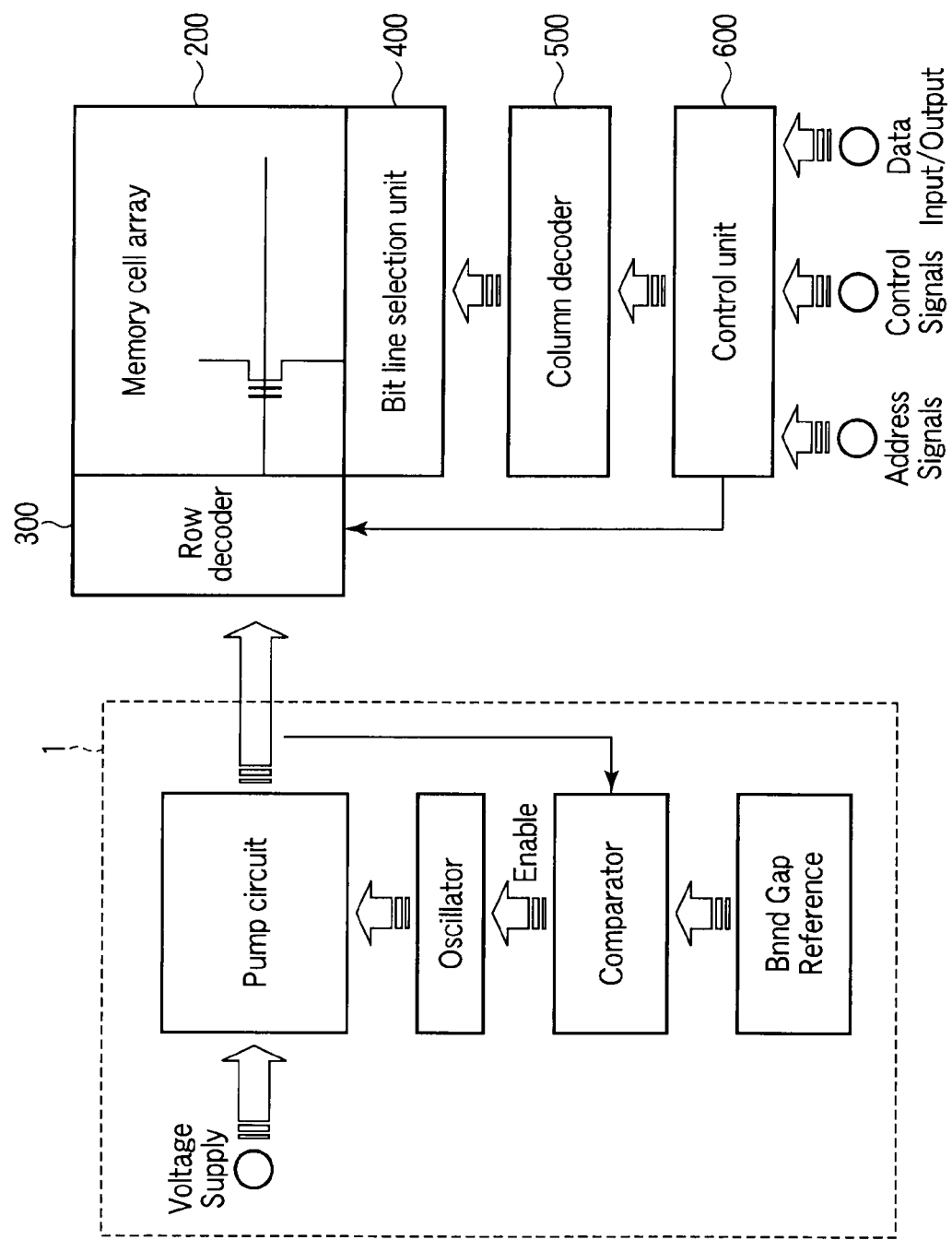
FIG. 20 is a circuit diagram of a power circuit according to a fourth embodiment of the invention which is applied to a NAND flash memory.

Next, a power circuit and a power stabilizing method according to a fourth embodiment of the invention will be explained with reference to FIG. 20. FIG. 20 is a block diagram of a NAND flash memory according to the fourth embodiment. In FIG. 20, a power circuit 1 of the fourth embodiment is applied to a power unit of a NAND flash memory. That is, internal power supplied from the power circuit 1 is supplied to a row decoder and a sense amplifier in, for example, a write operation, a read operation, or an erase operation.

As shown in FIG. 20, the NAND flash memory includes not only the power circuit 1 described above but also a memory cell array 200, a row decoder 300, a bit line selection unit 400, a column decoder 500, and a control unit 600. First, the configuration of the memory cell array 2 will be explained.

<Power Circuit 1>

As described above, the power circuit 1 steps up power supply potential VDD, thereby generating internal potentials V1 to Vn. Then, the power circuit 1 applies the generated internal potentials V1 to Vn to row decoder 300. The internal potentials V1 to Vn include, for example, the voltages (VGPM, VPASS) in a write operation and the voltages (VCGR, VREAD) in a read operation.

Here, voltage VPGM is as high a voltage as causes charges in the channel of memory cell transistor MT to be injected into the charge storage layer and the threshold value of memory cell transistor MT to transit to another level. Voltage VPASS is a voltage that turns on memory cell transistor MT. Voltage VCGR is a voltage whose value is varied according to data to be read out. Voltage VREAD is a voltage that turns on memory cell transistor MT, regardless of the data in memory cell transistor MT. Voltage VCGR is a voltage that is varied according to data to be read out.

<Configuration of Memory Cell Array 200>

The memory cell array 200 includes a plurality of nonvolatile memory cell transistors MT capable of holding data. Each of the memory cell transistors MT is an n-channel MOS transistor that has a stacked gate including, for example, a charge storage layer and a control gate. The control gate of memory cell transistor MT functions as a word line. Memory cell transistor MT has its drain electrically connected to a bit line and its source electrically connected to a source line. Memory cell array 100 has blocks BLK0 to BLKs (s is a natural number) each including a plurality of nonvolatile memory cell transistors MT.

Memory cell array 100 includes blocks BLK0 to BLKs (not shown). Each of blocks BLK0 to BLKs includes a plurality of NAND strings each of which is composed of a series connection of nonvolatile memory cell transistors MT. Each of the NAND strings includes, for example, 64 memory cell transistors MT and select transistors ST1, ST2. Each of the memory cell transistors MT has a NONOS structure that has a charge storage layer (e.g., an insulating layer) formed above a semiconductor substrate via a gate insulating film, an insulating film which is formed on the charge storage layer and whose permittivity is higher than that of the charge storage layer (hereinafter, referred to as a block layer), and a control gate electrode formed on the block layer. The number of memory cell transistors MT is not limited to 64 and may be 128, 256, 512, or the like. In the memory cell transistors MT, adjacent transistors MT share a source and a drain. The memory cell transistors MT are arranged in such a manner that their current paths are connected in series between select transistors ST1 and ST2. The drain region on one-end side of the series-connected memory cell transistors MT is connected to the source region of select transistor ST1 and the source region on the other-end side is connected to the drain region of select transistor ST2.

The control gate electrodes of the memory cell transistors MT in the same row are connected to any one of word lines WL0 to WL63 in a common connection manner. The gate electrodes of select transistors ST1 and ST2 for the memory cell transistors MT in the same row are connected to select gate lines SGD1 and SGS1 respectively in a common connection manner. Hereinafter, to simplify the explanation, when there is no need to distinguish between word lines WL0 to WL63, they will simply be referred to as the word lines WL. In memory cell array 200, the drains of select transistors ST1 in the same column are connected to any one of bit lines BL0 to BLn in a common connection manner. Hereinafter, when there is no need to distinguish between bit lines BL0 to BLn, they will simply be referred to as the bit lines BL (n: a natural number). The sources of select transistors ST2 are connected to a source line SL in a common connection manner. Both of select transistors ST1, ST2 are not necessarily needed. Only one of them may be used, provided that it can select a NAND string.

Data is written into a plurality of memory cell transistors MT connected to the same word line WL at the same time. This unit of writing is called a page.

A plurality of NAND strings are erased in blocks BLK simultaneously.

<Row Decoder 300>

Next, row decoder 300 will be explained. On the basis of a selection signal supplied from a block decoder (not shown), row decoder 300 selects a row direction of memory cell array 200 corresponding to the selected block BLK. Then, row decoder 300 applies the voltages supplied from power circuit 1 to the select gate lines SGD1, SGS1, and word lines WL0 to WL63.

<Bit Line Selection Unit 400>

Next, bit line selection unit 400 will be explained. Bit line selection unit 400 selects a bit line BL necessary for writing or reading data. That is, for example, when data is written, bit line selection unit 400 selects a bit line BL connected to a memory cell transistor MT to be written into and writes data. In addition, when data is read, bit line selection unit 400 selects a bit line BL connected to a memory cell transistor MT to be read from and reads data.

<Column Decoder 500>

Next, column decoder 500 will be explained. Column decoder 500 decodes a column address signal from control unit 600 and selects a column direction of memory cell array 200. That is, column decoder 500 selects a bit line BL.

<Control Unit 600>

Next, control unit 600 will be explained. Control unit 600 controls the overall operation of the NAND flash memory. That is, on the basis of the address and command given by a host (not shown), control unit 600 carries out the operation sequence in a write operation, a read operation, or an erase operation. Then, on the basis of the address and operation sequence, control unit 600 generates a block selection signal and a column selection signal. Control unit 600 outputs the block selection signal to row decoder 2.

As described above, power circuit 1 can be applied to the power unit of the NAND flash memory.

While in the fourth embodiment, the explanation has been given using the NAND flash memory as an example, a NOR flash memory may be used instead.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power circuit comprising:
a reference potential circuit which generates a reference potential;
a step-up circuit which generates an internal potential by stepping up a power supply potential and which includes
a comparison circuit which outputs an operation control signal indicating the result of comparison between a potential corresponding to the internal potential and the reference potential,
a differential amplifier circuit which is turned on or off by the operation control signal and uses the reference potential as one input, and
a switch element which performs on/off control according to the operation control signal and resets an output potential of the differential amplifier circuit; and
a signal width conversion circuit which converts a signal width of the operation control signal so as to make longer an on period of the differential amplifier circuit and an off period of the switch element.

2. The circuit according to claim 1,
wherein the signal width supplied to the differential amplifier circuit and the switch element is greater than a pulse width of the operation control signal output from the comparison circuit.

3. The circuit according to claim 2,
wherein the signal width conversion circuit includes
a clock shaping circuit which generates a first clock and a second clock on the basis of the operation control signal output from the comparison circuit,
a first latch circuit which latches a first signal in synchronization with the first clock and outputs the signal as a first result,
a second latch circuit which latches the first result in synchronization with the second clock and outputs the first result as a second result, and
a reset circuit which, on the basis of the first result and the second result, generates a third result for resetting the first signal, and
the signal width conversion circuit activates the differential amplifier circuit and deactivates the switch element according to the third result produced by the reset circuit.

4. The circuit according to claim 3,
wherein the reset circuit makes the third result high at the time when both the first result and the second result are made high.

5. The circuit according to claim 1,
wherein the differential amplifier circuit includes a first MOS transistor to whose gate the reference potential is applied,
the switch element includes a second MOS transistor to whose gate the operation control signal from the signal width conversion circuit is applied via an inverter and one end of whose current path is connected to one end of the current path of the first MOS transistor, and
a variation in the potential difference between one end of the current path of the first MOS transistor and the gate of the first MOS transistor is reduced by making the off period of the second MOS transistor longer than a pulse with of the operation control signal output from the comparison circuit.

6. The circuit according to claim 5,
wherein the signal width conversion circuit includes
a clock shaping circuit which generates a first clock and a second clock on the basis of the operation control signal output from the comparison circuit,
a first latch circuit which latches a first signal in synchronization with the first clock and outputs the first signal as a first result,
a second latch circuit which latches the first result in synchronization with the second clock and outputs the first result as a second result, and
a reset circuit which generates a third result for resetting the first signal on the basis of the first result and the second result, and
the signal width conversion circuit activates the differential amplifier circuit and deactivates the switch element according to the third result produced by the reset circuit.

7. The circuit according to claim 6,
wherein the reset circuit makes the third result high at the time when both the first result and the second result are made high.

8. The circuit according to claim 7, further comprising an RC circuit which outputs a second signal corresponding to the converted signal width, the second signal transiting from a first level to a second level higher than the first level,
wherein the RC circuit causes the second signal to transit from the second level to the first level at the time when the third result is made high.

9. The circuit according to claim 8, further comprising an inverter element to which the second signal from the RC circuit is input and which outputs the operation control signal with a converted signal width,
wherein the inverter keeps high the signal width of the operation control signal in a period during which the second signal is kept at the first level.

10. The circuit according to claim 8,
wherein the length of the period in which the second signal transits from the first level to the second level corresponds to a time constant the RC circuit has.

11. A power circuit comprising:
a reference potential circuit which generates a reference potential; and
a step-up circuit which generates an internal potential by stepping up a power supply potential and which includes
a comparison circuit which outputs an operation control signal indicating the result of comparison between a potential corresponding to the internal potential and the reference potential,
a differential amplifier circuit which is turned on or off by the operation control signal and uses the reference potential as one input, the differential amplifier circuit being set to normally on by an external control signal,
a switch element which performs on/off control according to the operation control signal and resets the output potential of the differential amplifier circuit, the switch element being set to normally off by the external control signal, and
an oscillation circuit provided behind the differential amplifier circuit, the on/off of the operation of the oscillation circuit being controlled by the operation control signal output from the comparison circuit.

12. The circuit according to claim 11, further comprising a pump circuit which the pump circuit outputs the internal potential according to the on/off state of the oscillation circuit.

13. The circuit according to claim 11,
wherein the differential amplifier circuit includes a first MOS transistor to whose gate the reference potential is applied,
the switch element includes a second MOS transistor to whose gate the operation control signal is applied via an inverter and one end of whose current path is connected to one end of the current path of the first MOS transistor, and
a variation in the potential difference between one end of the current path of the first MOS transistor and the gate of the first MOS transistor is reduced by making the second MOS transistor normally off.

14. A stabilizing method for a power circuit which includes a reference potential circuit which generates a reference potential and a step-up circuit which generates an internal potential by stepping up a power supply potential, the method comprising:
outputting an operation control signal indicating the result of comparison between a potential corresponding to the internal potential and the reference potential;
turning on or off a differential amplifier circuit based on the operation control signal, the differential amplifier circuit using the reference potential as one input;
resetting the output potential of the differential amplifier circuit based on the operation control signal by performing on/off control of a switch element; and
making longer an on period of the differential amplifier circuit and an off period of the switch element or making the differential amplifier circuit normally on and the switch element normally off.

15. The method according to claim 14, further comprising:
making the signal width supplied to the differential amplifier circuit and the switch element greater than a pulse width of the operation control signal indicating the result of comparison.

16. The method according to claim 14,
wherein the differential amplifier circuit includes a first MOS transistor to whose gate the reference potential is applied,
the switch element includes a second MOS transistor to whose gate the operation control signal is applied and one end of whose current path is connected to one end of the current path of the first MOS transistor, and
a variation in the potential difference between one end of the current path of the first MOS transistor and the gate of the first MOS transistor is reduced by making the off period of the second MOS transistor longer than a pulse width of the operation control signal indicating the result of comparison.

17. The method according to claim 14, wherein the power circuit further includes a signal width conversion circuit which makes the on period of the differential amplifier circuit and the off period of the switch element longer than a pulse width of a pulse width of the operation control signal indicating the result of comparison,
wherein the signal width conversion circuit
generates a first clock and a second clock on the basis of the operation control signal indicating the result of comparison,
latches a first signal in synchronization with the first clock and outputs the first signal as a first result,
latches the first result in synchronization with the second clock and outputs the first result as a second result, and
generates a third result for resetting the first signal on the basis of the first result and the second result.

18. The method according to claim 17, further comprising:
making the third result high at the time when both the first result and the second result are made high.

19. The method according to claim 18,
wherein the signal width conversion circuit outputs a second signal corresponding to the signal width of the operation control signal on the basis of the third result, the second signal transiting from a first level to a second level higher than the first level, and
causes the second signal to transit from the second level to the first level at the time when the third result is made high.

20. The method according to claim 19, wherein the signal width conversion circuit includes an inverter element to which the second signal is input and which outputs the operation control signal with converted signal width,
wherein the inverter keeps high the signal width of the operation control signal in a period during which the second signal is kept at the first level.

* * * * *